US012707654B2

(12) United States Patent
Shekhar et al.

(10) Patent No.: US 12,707,654 B2
(45) Date of Patent: Aug. 11, 2026

(54) TECHNOLOGIES FOR LOW-LEAKAGE ON-CHIP CAPACITORS

(71) Applicant: Intel Corporation, Santa Clara, CA (US)

(72) Inventors: Sameer Shekhar, Portland, OR (US); Amit K. Jain, Sherwood, OR (US); Chin Lee Kuan, Bentong (MY)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 17/711,736

(22) Filed: Apr. 1, 2022

(65) Prior Publication Data

US 2023/0317773 A1 Oct. 5, 2023

(51) Int. Cl.

*H10D 1/00* (2025.01)
*H03H 1/00* (2006.01)
*H05K 1/11* (2006.01)
*H05K 1/16* (2006.01)
*H10D 1/68* (2025.01)

(52) U.S. Cl.

CPC .......... *H10D 1/043* (2025.01); *H03H 1/0007* (2013.01); *H05K 1/112* (2013.01); *H05K 1/162* (2013.01); *H10D 1/716* (2025.01); *H03H 2001/0014* (2013.01)

(58) Field of Classification Search

CPC .. H05K 1/11–119; H05K 1/162; H05K 1/112; H05K 1/115; H01L 23/5223; H01L 23/5222; H01L 23/5226; H01L 2225/06541; H10D 1/692; H10D 1/60; H10W 20/495; H10W 20/496; H10W 20/484; H10W 70/6528

See application file for complete search history.

(56) References Cited

U.S. PATENT DOCUMENTS

| | | | | |
|---|---|---|---|---|
| 8,071,890 | B2 * | 12/2011 | Hsu | H05K 1/0228 174/262 |
| 2004/0067600 | A1 * | 4/2004 | Chatterjee | H01L 23/5222 257/E23.144 |
| 2004/0089471 | A1 * | 5/2004 | Andoh | H05K 3/4069 174/262 |
| 2009/0257167 | A1 * | 10/2009 | Kanno | H01G 7/06 361/278 |
| 2010/0173495 | A1 * | 7/2010 | Thakur | H01L 21/67115 438/785 |

(Continued)

*Primary Examiner* — Jose R Diaz
(74) *Attorney, Agent, or Firm* — Alliance IP, LLC

(57) ABSTRACT

Technologies for low-leakage and low series resistance on-chip capacitors are disclosed. In the illustrative embodiment, each electrode of a capacitor is formed from two metal layers and vias between the metal layers. A high-k dielectric layer is between the metal layers. The electrodes are displaced relative to each other on the plane defined by the high-k dielectric layer. As a result, electric field lines of the capacitor are parallel to the high-k dielectric layer. The electrodes can be displaced from each other by more than the thickness of the high-k dielectric layer, reducing the leakage current through the high-k dielectric layer as compared to a capacitor with field lines perpendicular to the high-k dielectric layer. Such a capacitor may be used to provide power to circuits in a low-power state with little leakage current and/or may be used to absorb radiofrequency (RF) interference.

21 Claims, 17 Drawing Sheets

(56) References Cited

U.S. PATENT DOCUMENTS

| | | | | |
|---|---|---|---|---|
| 2016/0190113 | A1 | 6/2016 | Sharan et al. | |
| 2021/0399716 | A1 | 12/2021 | Yu et al. | |
| 2022/0262567 | A1 * | 8/2022 | Lee | H01G 4/012 |

* cited by examiner

FIG. 3
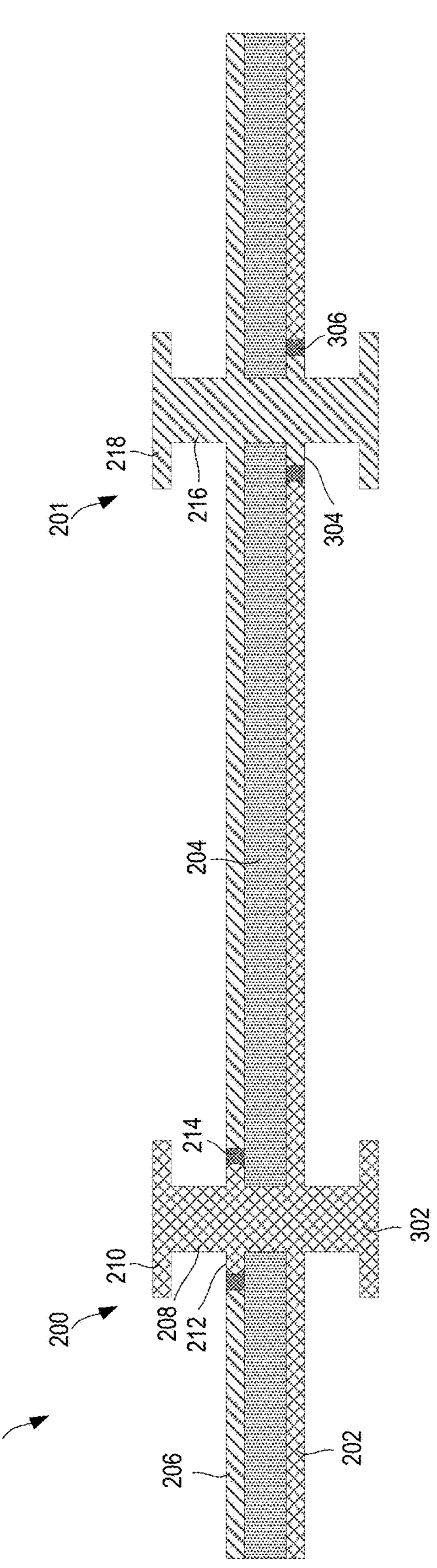
306
218
216
304
201
204
214
302
210
208
212
200
108
206
202

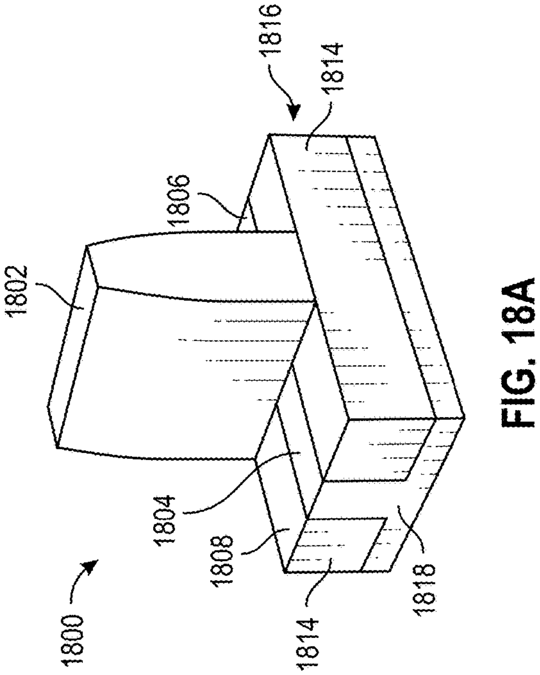
FIG. 18A
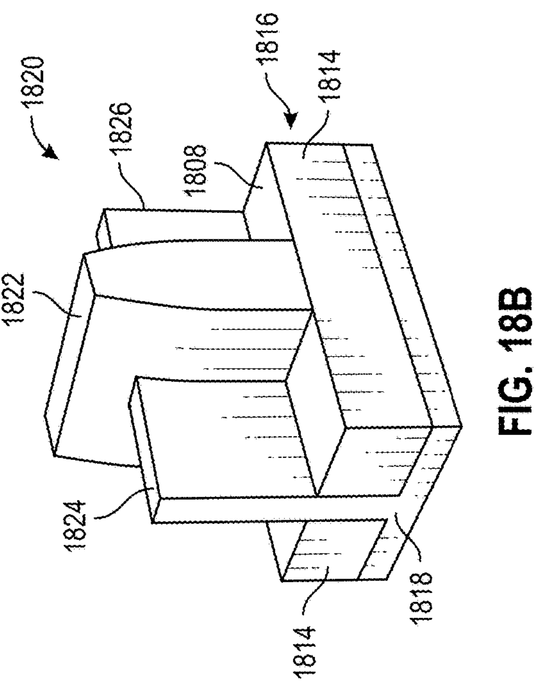
FIG. 18B
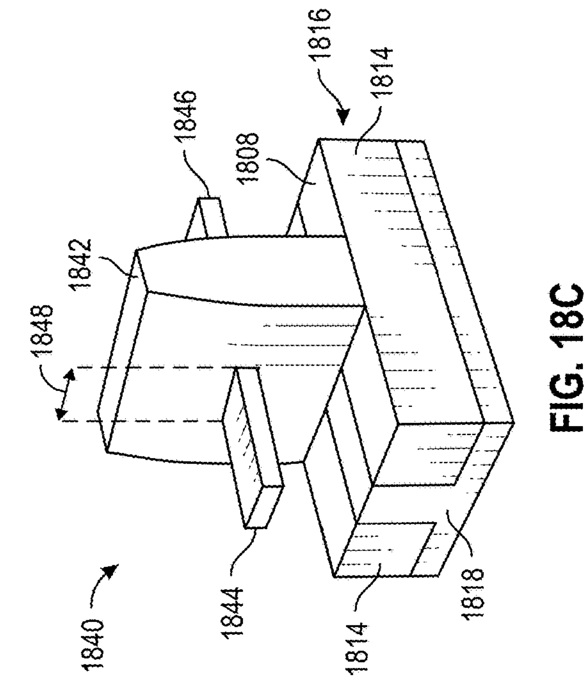
FIG. 18C
1860 1862 1864 1866 1868 1808 1814 1816 1818
FIG. 18D

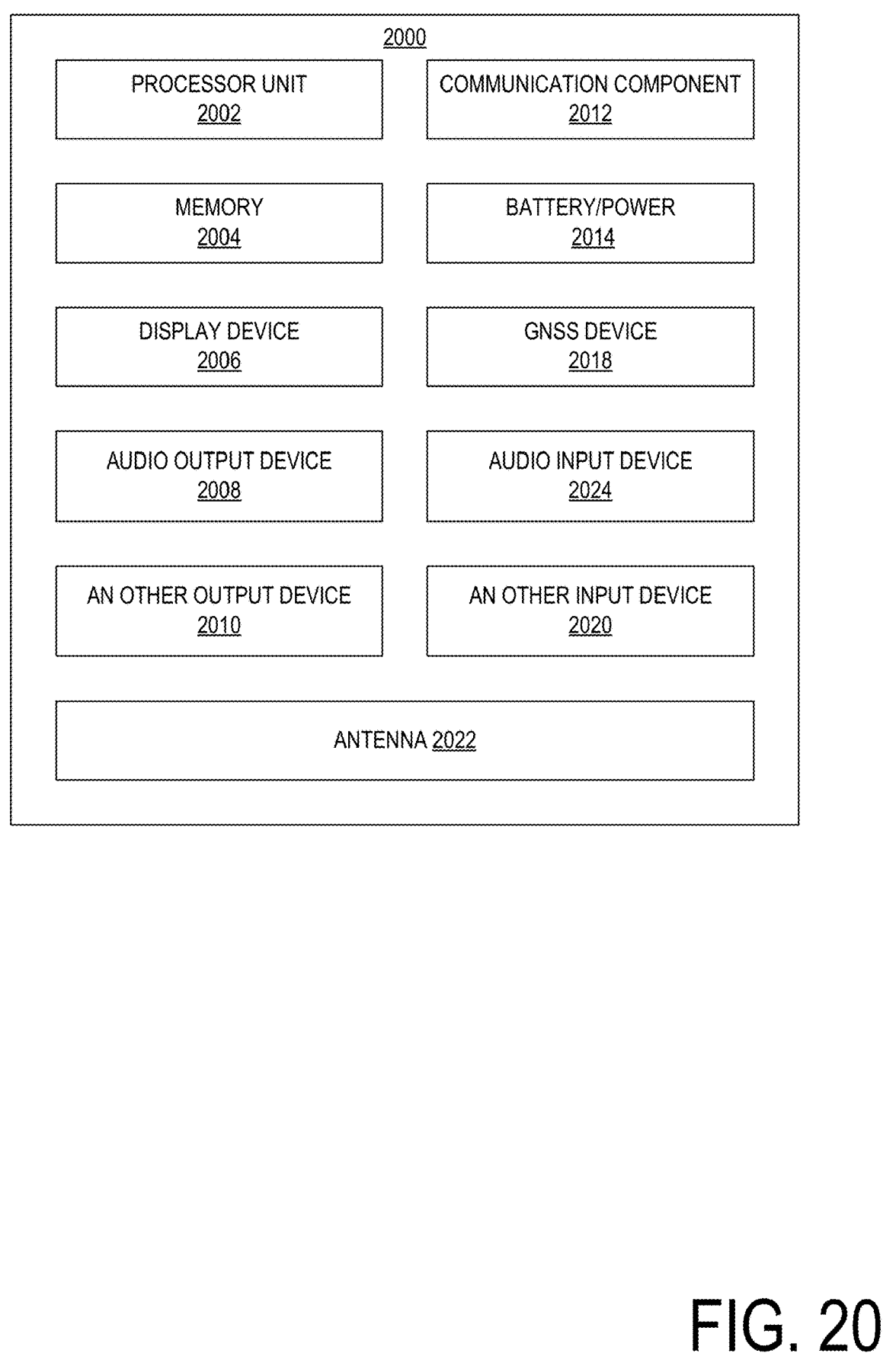

2000

PROCESSOR UNIT 2002

COMMUNICATION COMPONENT 2012

MEMORY 2004

BATTERY/POWER 2014

DISPLAY DEVICE 2006

GNSS DEVICE 2018

AUDIO OUTPUT DEVICE 2008

AUDIO INPUT DEVICE 2024

AN OTHER OUTPUT DEVICE 2010

AN OTHER INPUT DEVICE 2020

ANTENNA 2022

FIG. 20

TECHNOLOGIES FOR LOW-LEAKAGE ON-CHIP CAPACITORS

BACKGROUND

Capacitors formed or connected to semiconductor dies can perform several functions. An on-chip metal-insulator-metal (MIM) capacitor can be used to provide a stable voltage when components change a current draw in a short amount of time. A MIM capacitor may be used to provide a stable voltage source for components in a low-power state, such as a connected standby case. However, a large MIM capacitor may have a relatively large leakage current, dissipating a relatively large amount of power compared to the power needed for the low-power state.

In some cases, a capacitor with a low series resistance may be used to absorb radiofrequency signals. However, MIM capacitors may have too high of a series resistance, and the circuit path to off-chip capacitors may also have a relatively high series resistance.

BRIEF DESCRIPTION OF THE DRAWINGS

FIG. 3 is a cross-sectional view of one embodiment of the capacitor of FIG. 2.

FIGS. 18A-18D are perspective views of example planar, gate-all-around, and stacked gate-all-around transistors.

FIG. 20 is a block diagram of an example electrical device that may include a microelectronic assembly, in accordance with any of the embodiments disclosed herein.

DETAILED DESCRIPTION

Figure 1:
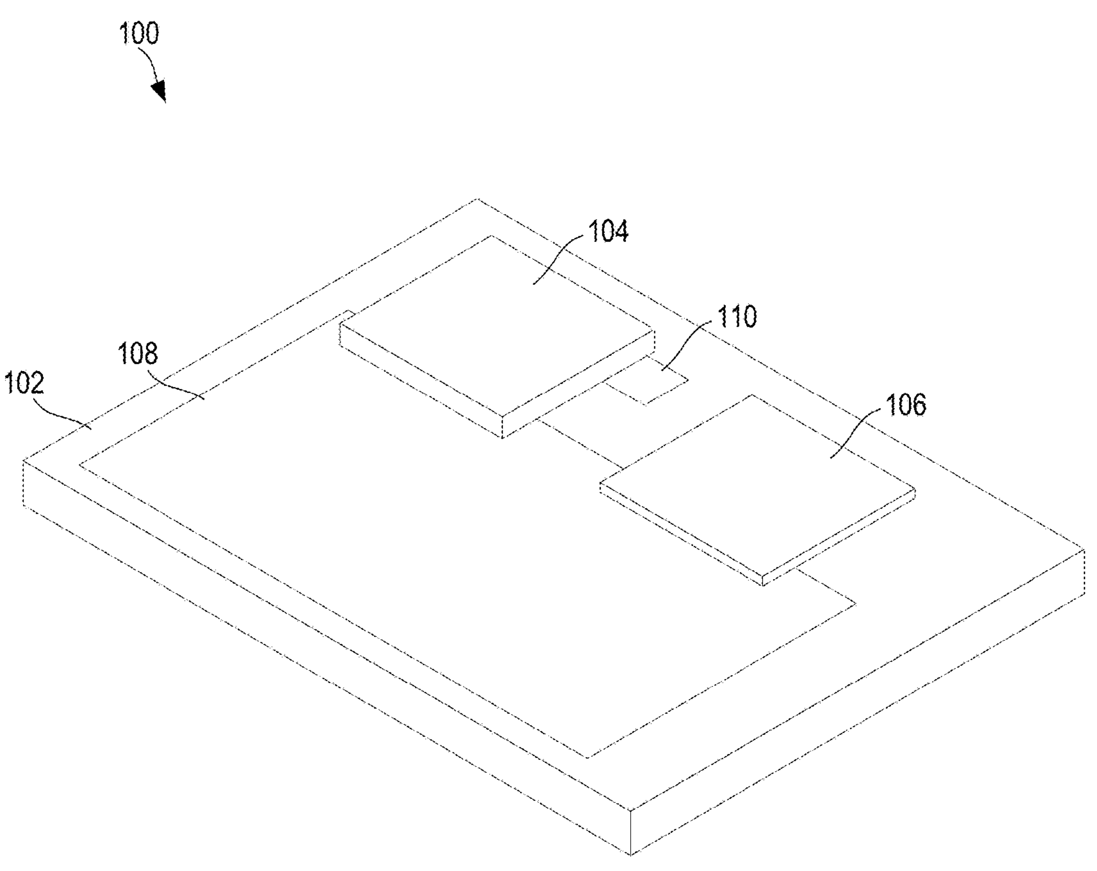
FIG. 1 is an isometric view of one embodiment of a system with capacitors and several integrated circuit dies.

In various embodiments disclosed herein, a capacitor on a die may be formed by electrodes on one or more metal layers and a dielectric layer. Each electrode of the capacitor is formed by part of an upper metal layer, part of a lower metal layer, and one or more vias between the metal layers. The electrodes displaced from each other in a direction parallel to the metal layers. A high-k dielectric is between the metal layers. In use, electric field lines extend from one electrode to the other through the high-k dielectric in a direction parallel to the metal layers. As the gap between the electrodes can be relatively large, such a capacitor has lower leakage current. Additionally, such a capacitor can have a shorter current path, reducing both the series resistance and the series inductance. In some embodiments, a capacitor designed in that manner can be used to absorb radiofrequency (RF) interference. A standard metal-insulator-metal on-die capacitor may have too high of a series resistance to absorb RF interference.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, the central axis of a magnetic plug that is substantially coaxially aligned with a through hole may be misaligned from a central axis of the through hole by several degrees. In another example, a substrate assembly feature, such as a through width, that is described as having substantially a listed dimension can vary within a few percent of the listed dimension.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

Reference is now made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Referring now to FIG. 1, in one embodiment, a system 100 includes a base die 102 that supports other dies, such as a compute die 104 and a system-on-a-chip (SoC) 106. In the illustrative embodiment, the compute die 104 and/or the SoC 106 may draw power from a high-capacitor metal-insulator-metal (MIM) capacitor 108 with field lines perpendicular to a surface of the die 102, as discussed in more detail below in regard to FIGS. 2 and 3. The MIM capacitor 108 may have a relatively high capacitance and can help provide a stable voltage to the compute die 104 and the SoC 106. The compute die 104 and/or SoC 106 may have low-power states, in which they draw a relatively small amount of current. The MIM capacitor 108 may be able to support the low current state, but with a relatively large leakage current.

In order to support the compute die 104 and/or the SoC 106 in low current states, the base die 102 includes an additional capacitor 110 with field lines parallel to the surface of the base die 102, as discussed in more detail below in regard to FIGS. 4 and 5. The capacitor 110 may have a relatively low capacitance compared to the capacitor 108, but with a relative leakage current that is even lower.

In the illustrative embodiment, the base die 102 supports additional dies 104, 106 and provides power to the dies 104, 106 through the capacitors 108, 110. The base die 102 may be made of any suitable material, such as silicon, other semiconductors, or polymers. In addition to the capacitors 108, 110 described below, the base die 102 may include additional structure, such as interconnects, compute blocks, memory blocks, etc. It should be appreciated that the configuration shown in FIG. 1 is merely one possible embodiment and that other configurations are possible. For example, capacitors 108 and/or 110 may be on a stand-alone die, may be on the compute die 104, may be on the SoC 106, etc. In general, the capacitors 108 and/or 110 may be integrated into any suitable die.

Figure 2:
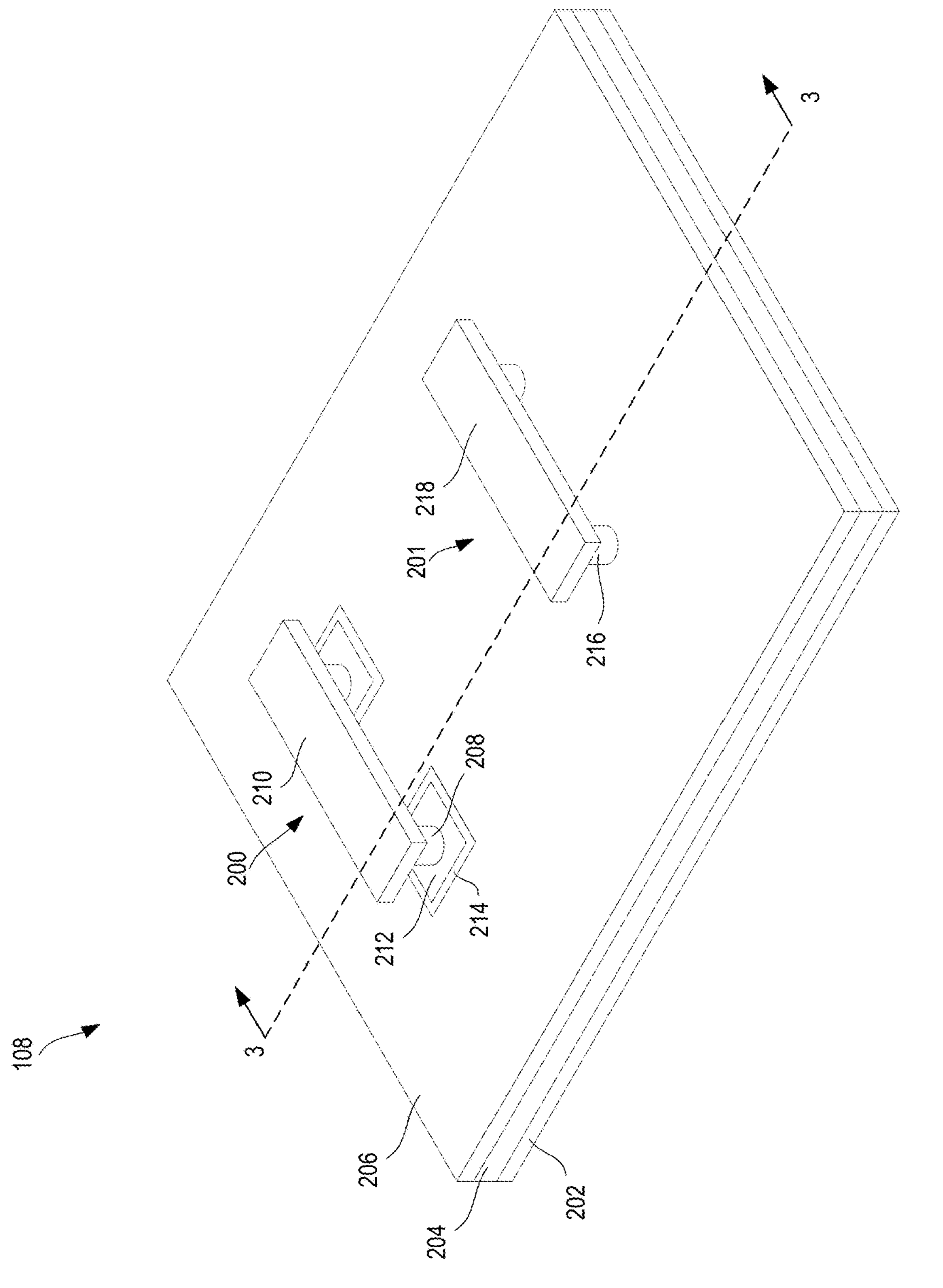
FIG. 2 is an isometric view of one embodiment of a capacitor of FIG. 1 with an electric field perpendicular to a high-k dielectric layer.

Referring now to FIG. 2, in one embodiment, the capacitor 108 with field lines perpendicular to the surface of the base die 102 is shown. FIG. 3 shows a cross-sectional view of the capacitor 108. The capacitor 108 includes a first electrode 200 and a second electrode 201. The first electrode 200 includes a large part of a first metal layer 202, and the second electrode 201 includes a large part of a second metal layer 206. A high-k dielectric layer 204 is between the first metal layer 202 and the second metal layer 206. The first electrode 200 also includes one or more vias 208, a pad 212 that forms part of the second metal layer 206, and one or more pads or traces 210, 302 on additional layers below the first metal layer 202 and/or above the second metal layer 206. Similarly, the second electrode 201 includes one or more vias 216, a pad 304 that forms part of the first metal layer 206, and one or more pads or traces 218, 208 on additional layers below the first metal layer 202 and/or above the second metal layer 206. Insulating area 214 isolates the pad 212 and the first electrode 200 from the second electrode 201 on the second metal layer 206. Similarly, insulating area 306 isolates the pad 304 and the second electrode 201 from the first electrode 200 on the first metal layer 202.

In use, the first electrode 200 is charged to a different voltage than the second electrode 201. Field lines extend perpendicularly through the high-k dielectric layer 204. The capacitor 108 can have a relatively high capacitance, such as about 200 $nF/mm^2$. However, the electrical series resistance is relatively high, such as about $400\times10^{-6}\Omega\times mm^2$, and the leakage current is high as well.

The first electrode 200 may be at, e.g., 0 volts, and the second electrode 201 may be at, 1 volt. In general, in use, the first electrode 200 and the second electrode 201 may have any suitable voltage level between them, such as 0.5-1.5 volts. In some embodiments, the first electrode 200 may be at the lower voltage, and, on other embodiments, the second electrode 201 may be at the lower voltage.

In the illustrative embodiment, the first metal layer 202, the second metal layer 206, and the vias 208, 216 are made of copper. In other embodiments, the first metal layer 202, the second metal layer 206, and/or the vias 208, 216 may be made of a different material, such as aluminum, polysilicon, and/or the like. In the illustrative embodiment, the first metal layer 202 may be supported by a silicon substrate, a silicon oxide layer, or any other suitable substrate or layer. Similarly, a silicon oxide or other suitable layer may be above the second metal layer 206. The capacitor 108 may include additional layers or connections not shown in FIGS. 2 and 3.

The high-k dielectric layer 204 may be any suitable material. As used herein, a high-k dielectric refers to a material with a relative permittivity of greater than 100, unless explicitly stated otherwise. In the illustrative embodiment, the high-k dielectric layer 204 has a relative permittivity of over 1,000. The high-k dielectric layer 204 may be made of or otherwise include barium titanate, lead zirconate titanate, conjugated polymers, calcium copper titanate, etc. The high-k dielectric layer 204 may have any suitable thickness, such as 0.02-1 micrometers. In the illustrative embodiment, the high-k dielectric layer 204 has a thickness of about 0.1 micrometers.

Figure 4:
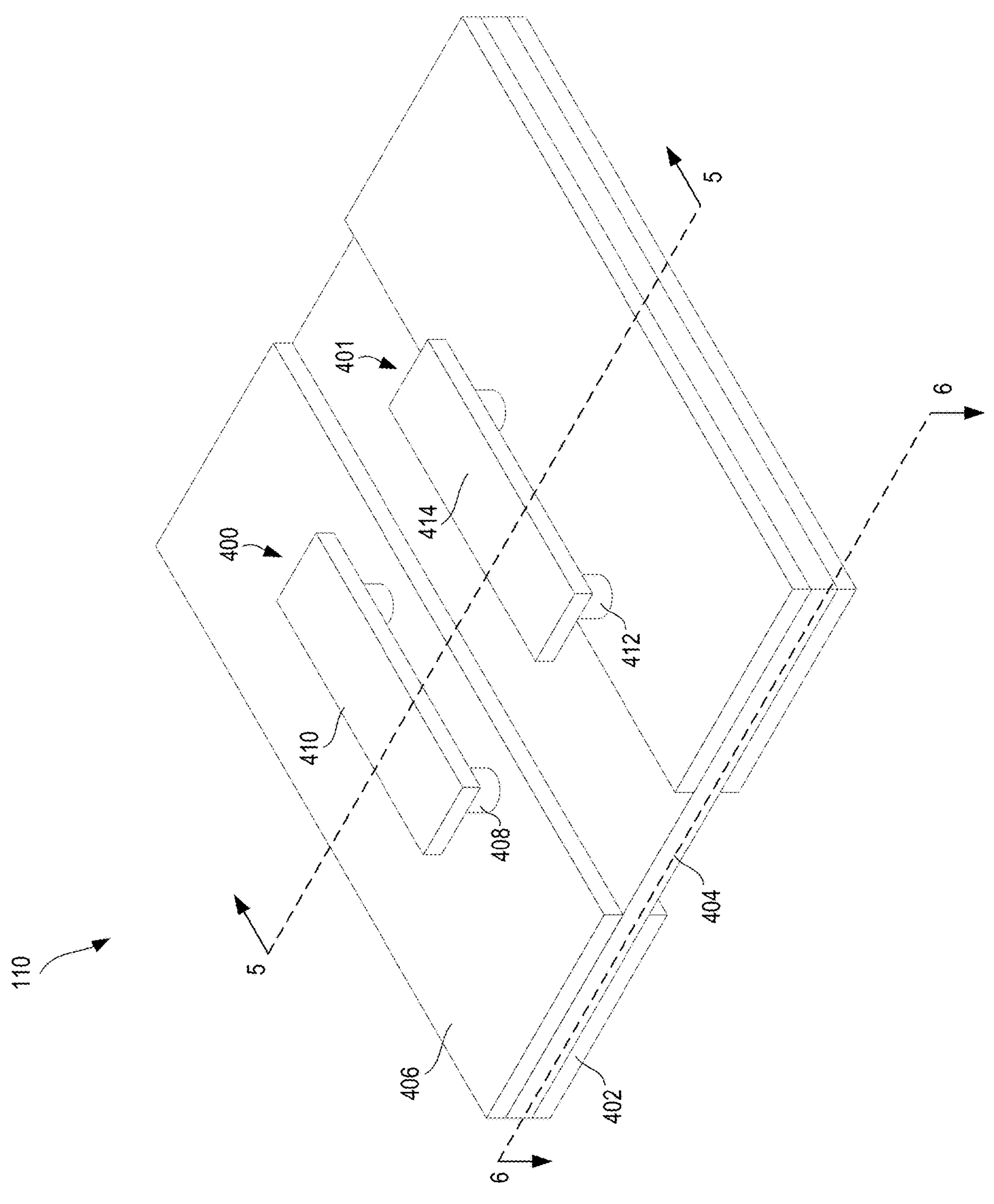
FIG. 4 is an isometric view of one embodiment of a capacitor of FIG. 1 with an electric field parallel to a high-k dielectric layer.
Figure 5:
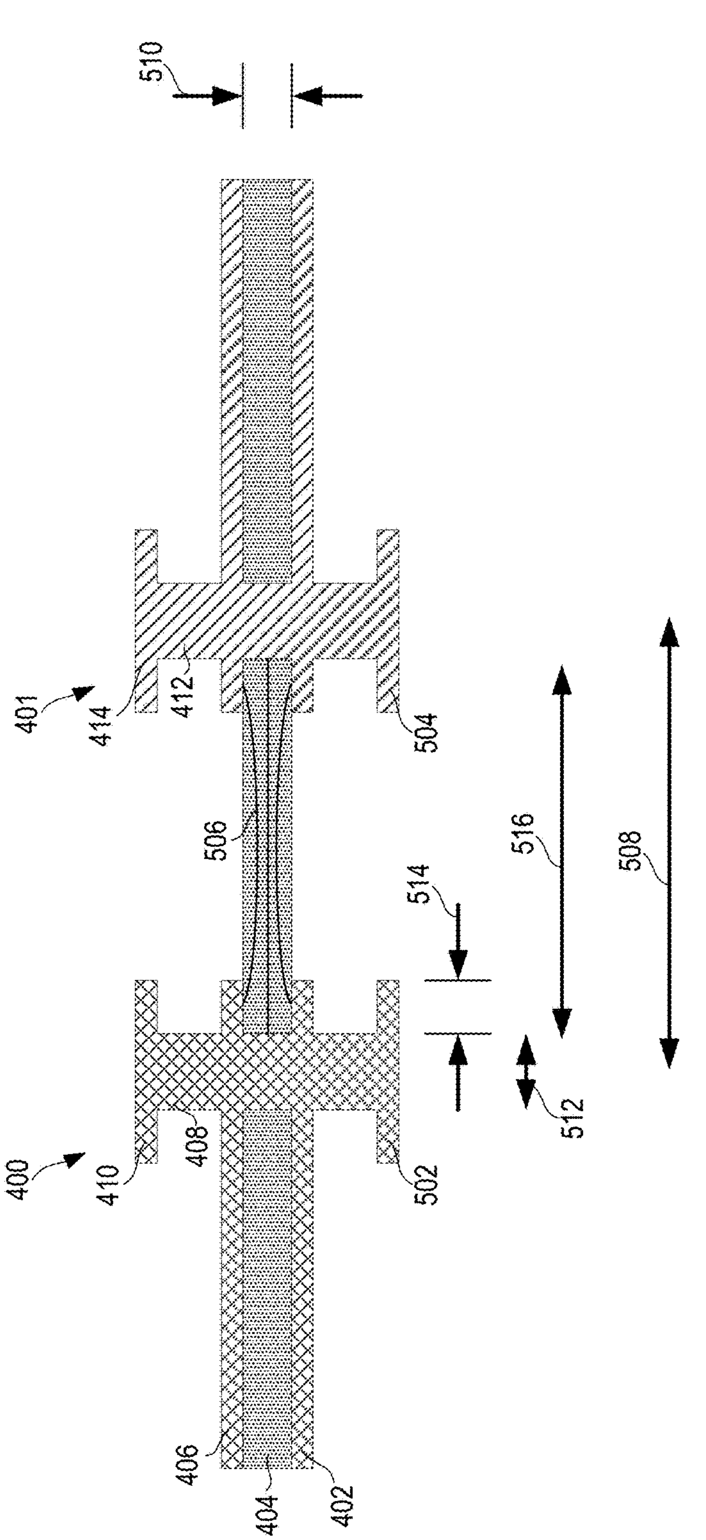
FIG. 5 is a cross-sectional view of one embodiment of the capacitor of FIG. 4.
Figure 6:
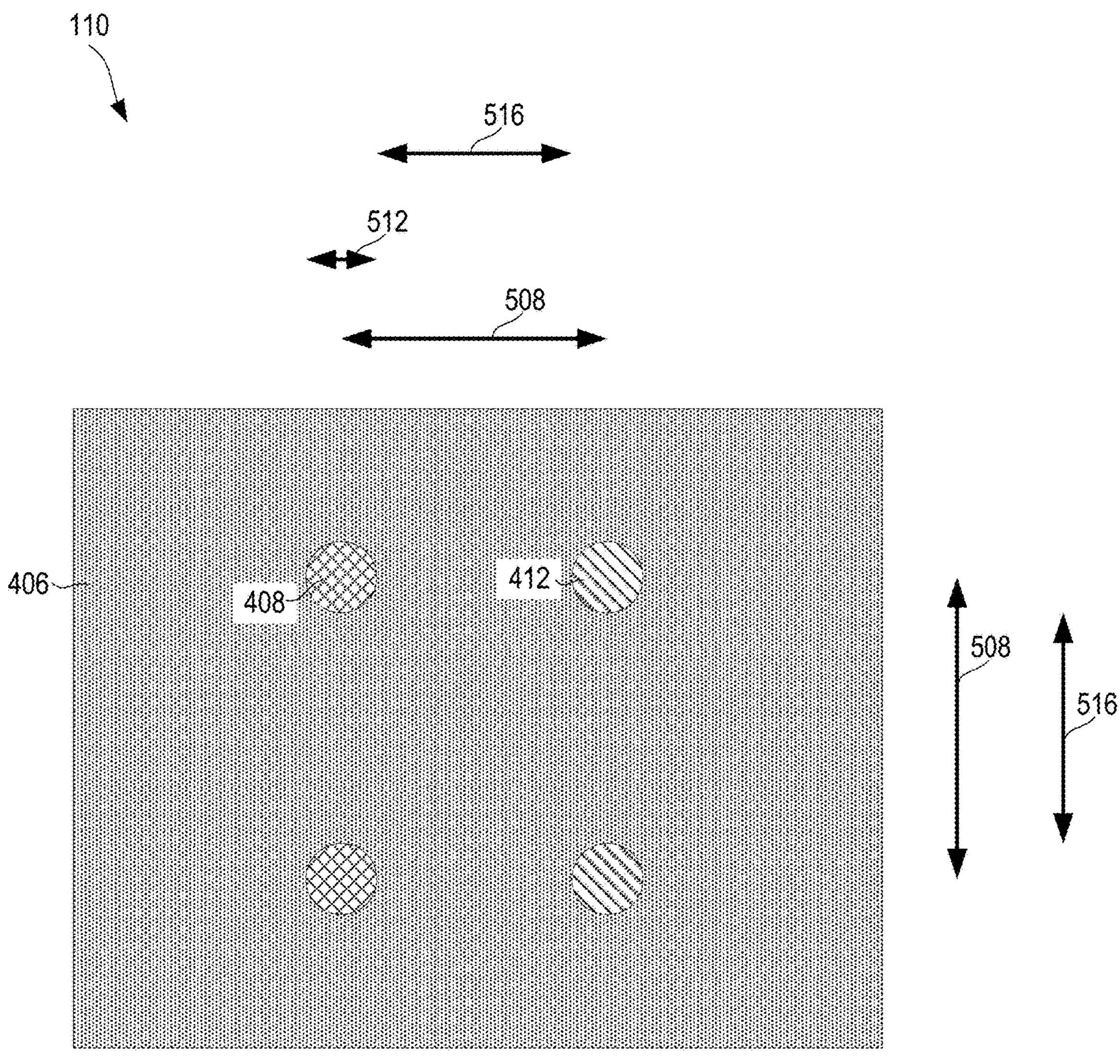
FIG. 6 is a cross-sectional view of one embodiment of the capacitor of FIG. 4.

Referring now to FIG. 4, in one embodiment, the capacitor 110 with field lines parallel to the surface of the base die 102 is shown. FIG. 5 shows a cross-sectional view of the capacitor 110 taken along line 5, perpendicular to a high-k dielectric layer 404. FIG. 6 shows a cross-sectional view of the capacitor 110 taken along line 6, parallel to the high-k dielectric layer 404.

The capacitor 110 includes a first electrode 400 and a second electrode 401. The first electrode 400 includes a part of a first metal layer 402 and a second metal layer 406. The second electrode also includes part of the first metal layer 402 and the second metal layer 406, with the portions of the second electrode 401 displaced relative to the first electrode 400. A high-k dielectric layer 404 is between the first metal layer 402 and the second metal layer 406. The first electrode 400 also includes one or more vias 408 and one or more pads or traces 410, 502 on additional layers below the first metal layer 402 and/or above the second metal layer 406. Similarly, the second electrode 401 includes one or more vias 412 and one or more pads or traces 414, 504 on additional layers below the first metal layer 402 and/or above the second metal layer 406. Between the first electrode 400 and the second electrode 401, the metal layers 406, 402 is removed and replaced with an insulator, such as silicon dioxide.

In use, the first electrode 400 is charged to a different voltage than the second electrode 401. Field lines 506 extend parallel through the high-k dielectric layer 404, as shown in FIG. 5. The field lines 506 may begin and end at the vias 408, 412, as well as the overhang of the metal layers 402, 406. The capacitor 110 can have a relatively lower capacitance compared to the capacitor 108, such as about 14 nF/mm$^2$. However, the electrical series resistance is relatively low compared to the capacitor 108, such as about $9.6\times10^{-6}\Omega\times\text{mm}^2$, and the leakage current is low as well.

In one embodiment, a distance 508 between vias 408, 412 may be on the order of a micrometer. A thickness 510 of the high-k dielectric layer 404 may be on the order of 0.1 micrometers. A width 512 of each via 408, 412 may be on the order of a micrometer. A distance 514 between each via 408, 412 and the edge of the electrode 400, 401 may be on the order of a micrometer. A distance 516 between the vias 408, 412 may be on the order of a micrometer. In one embodiment with the dimensions as described above, the electrodes 400, 401 with one pair of vias 408, 412 form a capacitor with a capacitance of 20×10−6 nF, a series resistance of 22 mΩ, and a leakage resistance of 6.25Ω. It should be appreciated that other dimensions may be used, such as embodiments in which some, any, or all dimensions 508-516 may be an order of magnitude smaller or larger.

The first electrode 400 may be at, e.g., 0 volts, and the second electrode 401 may be at, e.g., 1 volt. In general, in use, the first electrode 400 and the second electrode 401 may have any suitable voltage level between them, such as 0.5-5 volts. It should be appreciated that, as the electrodes 400, 401 are farther apart than electrodes 200, 201, the voltage across electrodes 400, 401 can be greater than that across 200, 201. In some embodiments, the first electrode 400 may be at the lower voltage, and, in other embodiments, the second electrode 401 may be at the lower voltage.

In some embodiments, metal layer 402 may be the same layer as metal layer 202, high-k dielectric layer 404 may be the same as high-k dielectric layer 204, and metal layer 406 may be the same layer as metal layer 406. As such, in some embodiments, capacitors 108, 110 may be formed contemporaneously on the same die, as discussed below in regard to FIG. 15.

In the illustrative embodiment, the structure of the capacitor 110 offers several advantages. The series resistance, series inductance, and leakage current for the capacitor 110 are less than for a capacitor 108 with an equivalent capacitance, although the capacitor 110 has a lower capacitance as a capacitor 108 with the same area. The capacitor 110 can be formed from the same metal layers and high-k dielectric layer as the capacitor 108, allowing a die to have both a capacitor 110 and a capacitor 108. The capacitor 110 may take up a relatively small area of the high-k dielectric layer, with the capacitor 108 taking up the majority of the area of the high-k dielectric layer.

The capacitor 110 has the electrodes 400, 401 displaced from each along the plane of the high-k dielectric layer 404. As a result, vias passing through the high-k dielectric layer 404 connected to one electrode 400, 401 do not result in a void in the other electrode 401, 400. Rather, additional vias 408, 412 can increase the capacitance of the capacitor 110. In use, current does not need to flow through large lengths of metal layers 202, 206, as for the capacitor 108, reducing the series parasitic resistance and inductance of the capacitor 110. The lower series parasitic resistance and inductance result in a higher corner (or cutoff) frequency for such a capacitor 110.

In some embodiments, radiofrequency (RF) interference may be present on voltage support devices of the system 100. In order for the RF interference to be absorbed, capacitors with low capacitance and low series parasitic resistance must be used. The capacitor 108 may not perform well for such a function, but one or more capacitors 110 can perform such a function. In some embodiments, the system 100 may include one or more on-die capacitors 110 to filter out each of several frequencies. For example, the system 100 may include one or more capacitors 110 with a capacitance of, e.g., 2.2-560 pF to filter out signals at, e.g., 1.9 GHz, 2.1 GHz, 2.4 GHz, 5.0 GHz, and/or 6.0 GHz. The use of on-die capacitors 110 to filter out RF interference can save on-board RFI shield cost as well as eliminate off-die capacitors to filter out RF interference.

Figure 7:
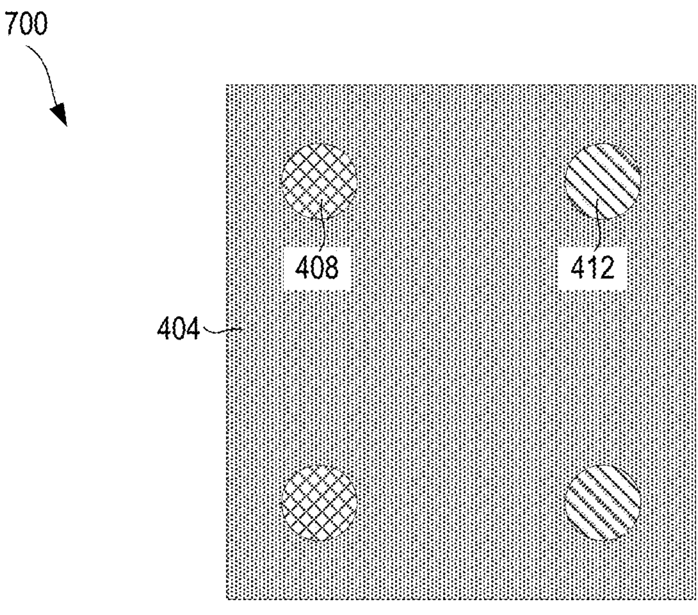
FIG. 7 is a cross-sectional view of one embodiment of a unit cell of a capacitor of FIG. 1.
Figure 8:
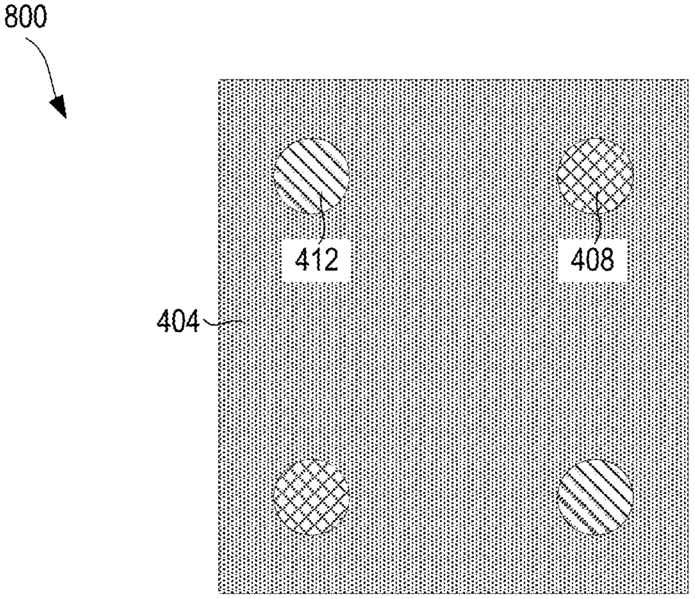
FIG. 8 is a cross-sectional view of one embodiment of a unit cell of a capacitor of FIG. 1.
Figure 9:
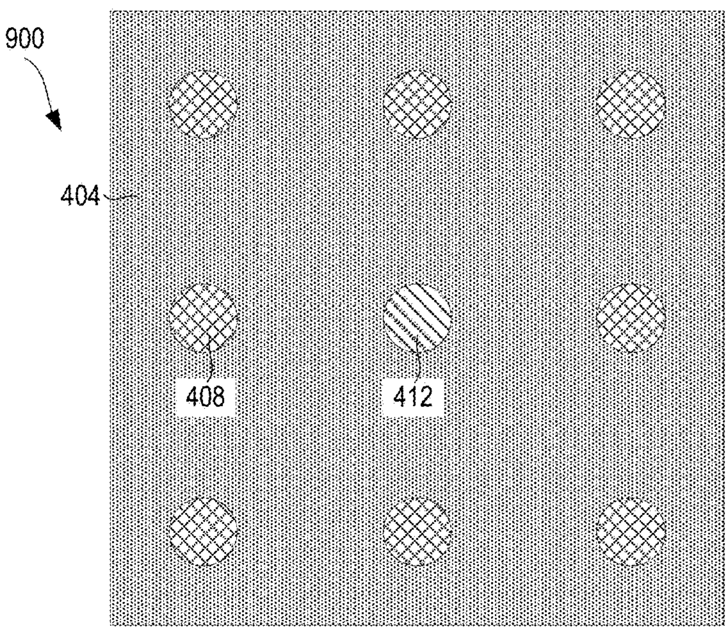
FIG. 9 is a cross-sectional view of one embodiment of a unit cell of a capacitor of FIG. 1.
Figure 10:
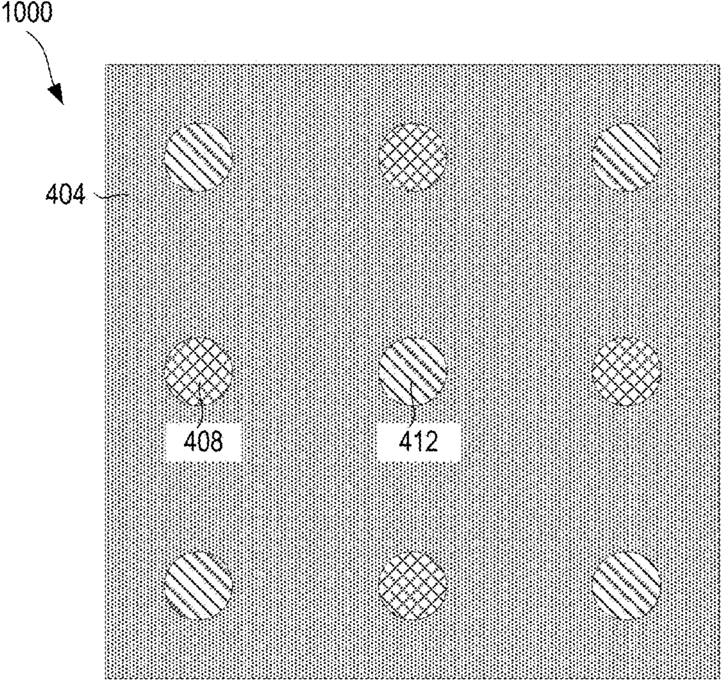
FIG. 10 is a cross-sectional view of one embodiment of a unit cell of a capacitor of FIG. 1.
Figures 11, 12:
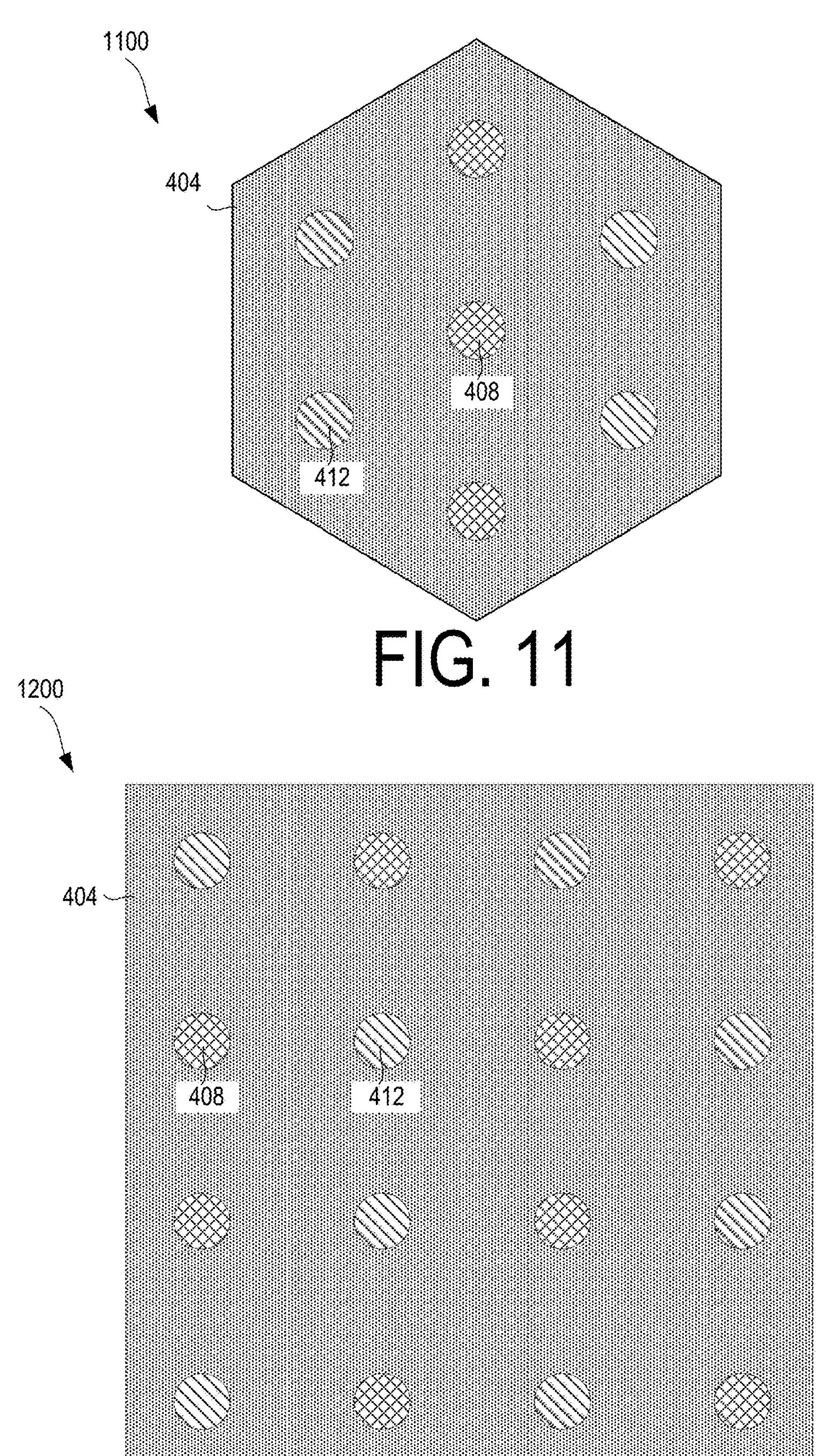
FIG. 11 is a cross-sectional view of one embodiment of a unit cell of a capacitor of FIG. 1.
FIG. 12 is a cross-sectional view of one embodiment of a unit cell of a capacitor of FIG. 1.

Referring now to FIGS. 7-12, in some embodiments, electrodes 400, 401 may be formed from an array of vias 408, 412, with unit cells being repeated several times to create a capacitor 110 with increased capacitance. A pad similar to the pads 212, 304 shown in FIGS. 2 and 3 may provide a connection for a via 408, 412 to the metal layers 402, 406, as appropriate. Unit cells may have vias 408, 412 in any suitable arrangement. For example, FIG. 7 shows a unit cell 700 with vias 408, 412 adjacent vias 408, 412 of the same electrode 400, 401. FIG. 8 shows a unit cell 800 with vias 408, 412 opposite vias 408, 412 of the same electrode 400, 401. FIG. 9 shows a unit cell 900 with via 412 of one electrode 401 surrounded by vias 408 of the other electrode 400. FIG. 10 shows a unit cell 1000 with vias 408 alternating with vias 412. FIG. 11 shows a unit cell 1100 with a hexagon shape and vias 408, 412 as shown. FIG. 12 shows a unit cell 12 with vias 408, 412 both adjacent and opposite vias 408, 412 of the other electrode 400, 401.

Figure 13:
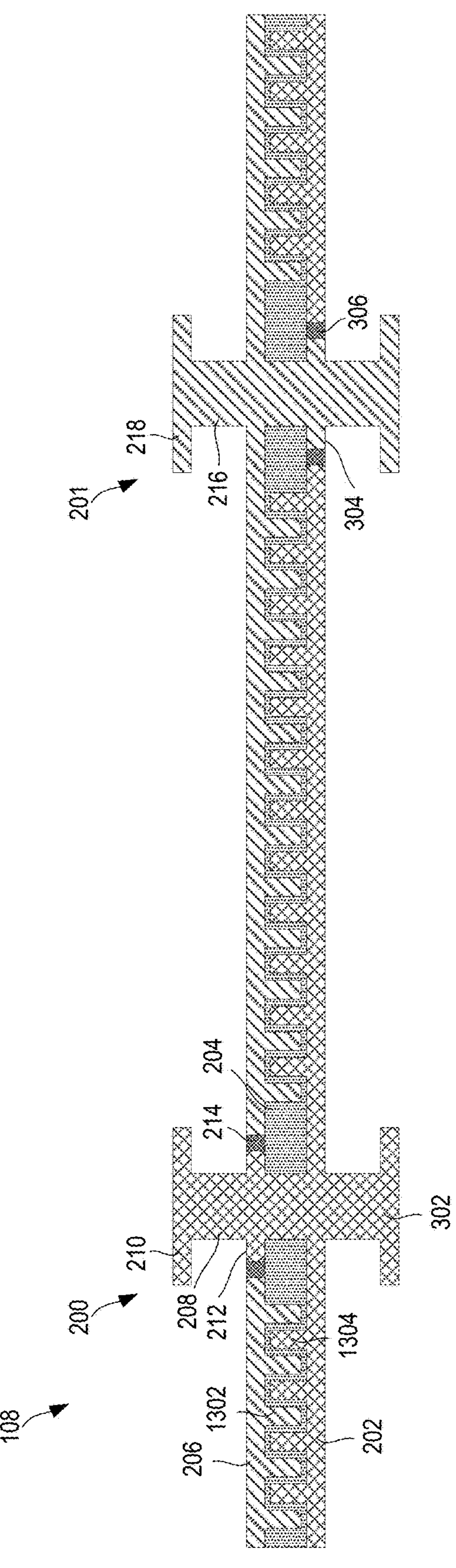
FIG. 13 is a cross-sectional view of one embodiment of the capacitor of FIG. 2.

Referring now to FIG. 13, in one embodiment, a capacitor 108 may be formed using deep trench technology, creating trenches 1302 that form part of electrode 201 and trenches 1304 that form part of electrode 200. In the illustrative embodiment, the trenches 1302, 1304 can increase the capacitance of the capacitor 108.

Figure 14:
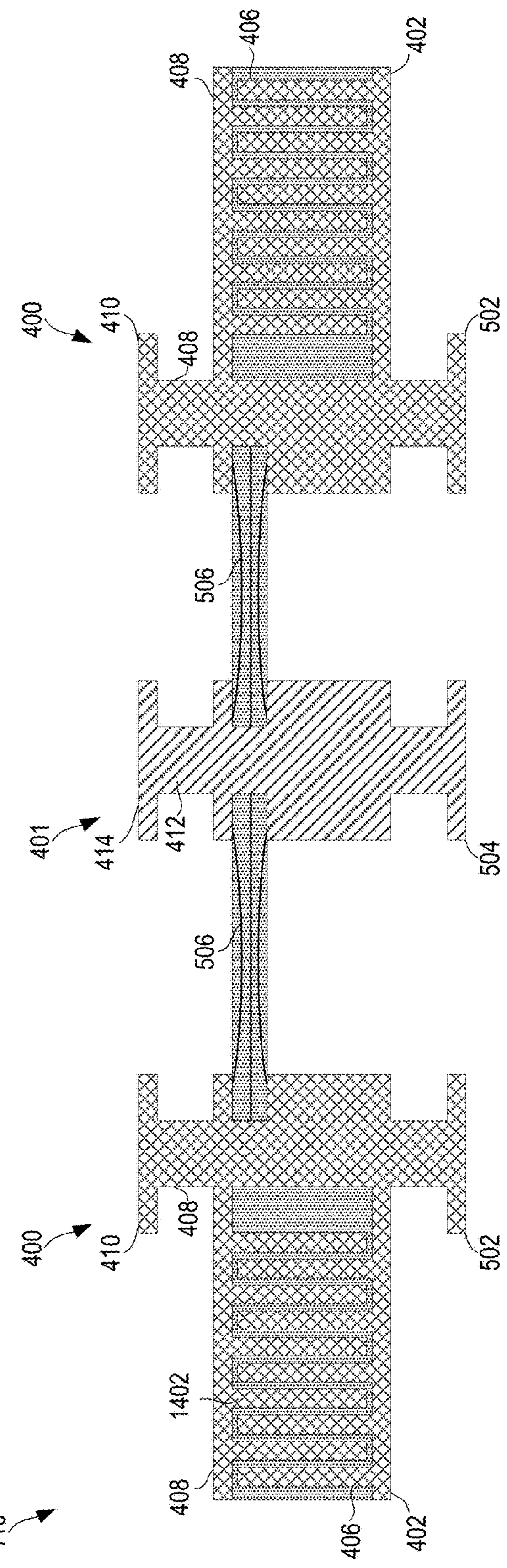
FIG. 14 is a cross-sectional view of one embodiment of the capacitor of FIG. 4.

Referring now to FIG. 14, in one embodiment a capacitor 110 may be created with deep trench technology, creating trenches 1402 that form part of electrode 400. Unlike for the capacitor 108, the capacitance of the capacitor 110 does not significantly change due to the use of deep trench. However, the capacitor 110 still operates, allowing deep trench technology to be used on the capacitor 108 on the same layers as the capacitor 110.

Figure 15:
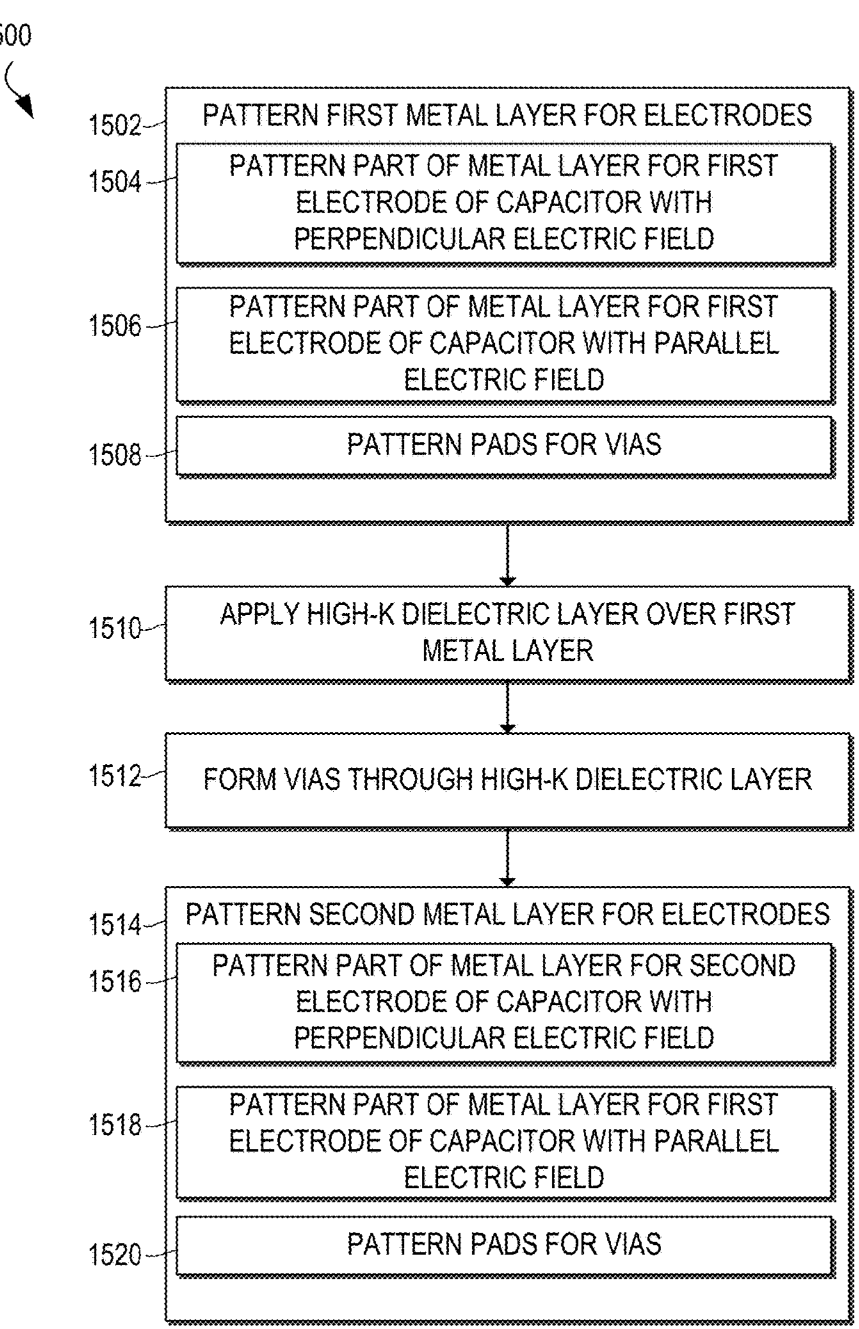
FIG. 15 is a flowchart of one embodiment of a method for creating the capacitors of FIG. 1.

Referring now to FIG. 15, a flowchart for a method 1500 creating on-die capacitors is shown. The method 1500 may be executed by a technician and/or by one or more automated machines. In some embodiments, one or more machines may be programmed to do some or all of the steps of the method 1500. Such a machine may include, e.g., a memory, a processor, data storage, etc. The memory and/or data storage may store instructions that, when executed by the machine, causes the machine to perform some or all of the steps of the method 1500.

The method 1500 begins in block 1502, a first metal layer is patterned for electrodes of capacitors 108 and/or 110. The metal layer may be made out of copper and may be adjacent a layer of, e.g., silicon dioxide or other insulator. In block 1504, part of the metal layer is patterned to form a first electrode of a capacitor 108 with an electric field perpendicular to the metal layer. In block 1506, part of the metal layer is patterned to form a bottom part of two electrodes for a capacitor 110 with an electric field parallel to the metal layer. In block 1508, in some embodiments, pads for vias may be patterned. For example, a via of one electrode may pass through a via of another electrode. In such an embodiment, an area around a pad for a via may be removed and an insulating layer may be added, such as silicon dioxide.

In block 1510, a high-k dielectric layer is applied over the first metal layer. In block 1512, vias may be formed through the high-k dielectric for one or both electrodes.

In block 1514, a second metal layer is patterned for electrodes of capacitors 108 and/or 110. The metal layer may be made out of copper. In block 1516, part of the metal layer is patterned to form a second electrode of a capacitor 108 with an electric field perpendicular to the metal layer. In block 1518, part of the metal layer is patterned to form a top part of two electrodes for a capacitor 110 with an electric field parallel to the metal layer. In block 1520, in some embodiments, pads for vias may be patterned. For example, a via of one electrode may pass through a via of another electrode. In such an embodiment, an area around a pad for a via may be removed and an insulating layer may be added, such as silicon dioxide.

It should be appreciated that, in some embodiments, additional layers may be added before and/or after those shown in FIG. 15, such as interconnect layers, compute layers, etc.

Figure 16:
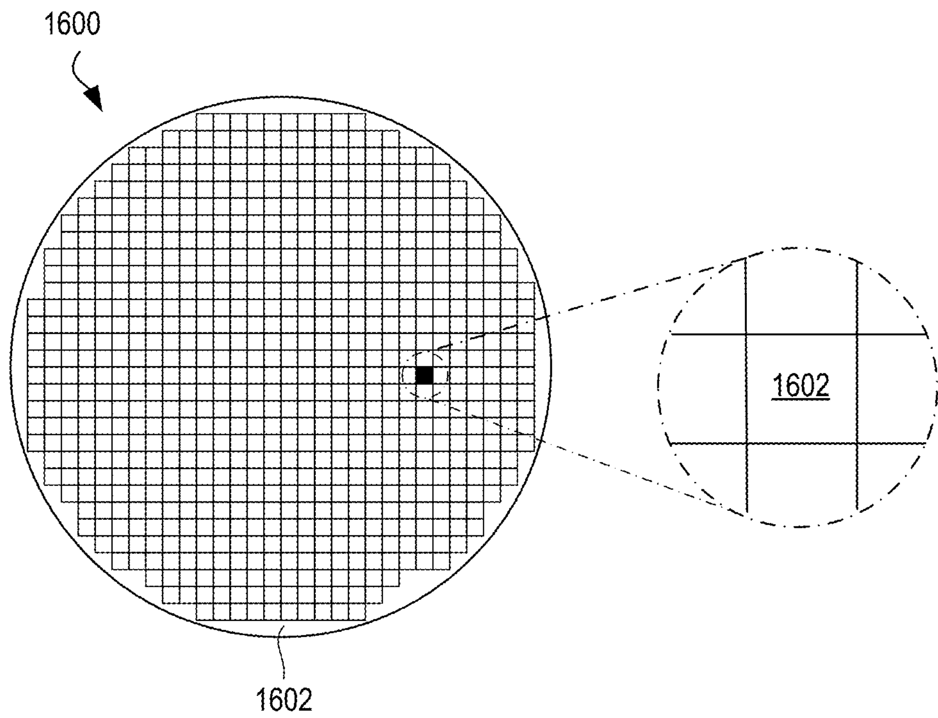
FIG. 16 is a top view of a wafer and dies that may be included in a microelectronic assembly, in accordance with any of the embodiments disclosed herein.

FIG. 16 is a top view of a wafer 1600 and dies 1602 that may include any of the capacitors 108, 110 disclosed herein. The wafer 1600 may be composed of semiconductor material and may include one or more dies 1602 having integrated circuit structures formed on a surface of the wafer 1600. The individual dies 1602 may be a repeating unit of an integrated circuit product that includes any suitable integrated circuit. After the fabrication of the semiconductor product is complete, the wafer 1600 may undergo a singulation process in which the dies 1602 are separated from one another to provide discrete "chips" of the integrated circuit product. The die 1602 may include one or more transistors (e.g., some of the transistors 1740 of FIG. 17, discussed below), supporting circuitry to route electrical signals to the transistors, passive components (e.g., signal traces, resistors, capacitors, or inductors), and/or any other integrated circuit components. In some embodiments, the wafer 1600 or the die 1602 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1602. For example, a memory array formed by multiple memory devices may be formed on a same die 1602 as a processor unit (e.g., the processor unit 2002 of FIG. 20) or other logic that is configured to store information in the memory devices or execute instructions stored in the memory array. Various ones of the microelectronic assemblies disclosed herein may be manufactured using a die-to-wafer assembly technique in which some dies are attached to a wafer 1600 that include others of the dies, and the wafer 1600 is subsequently singulated.

Figure 17:
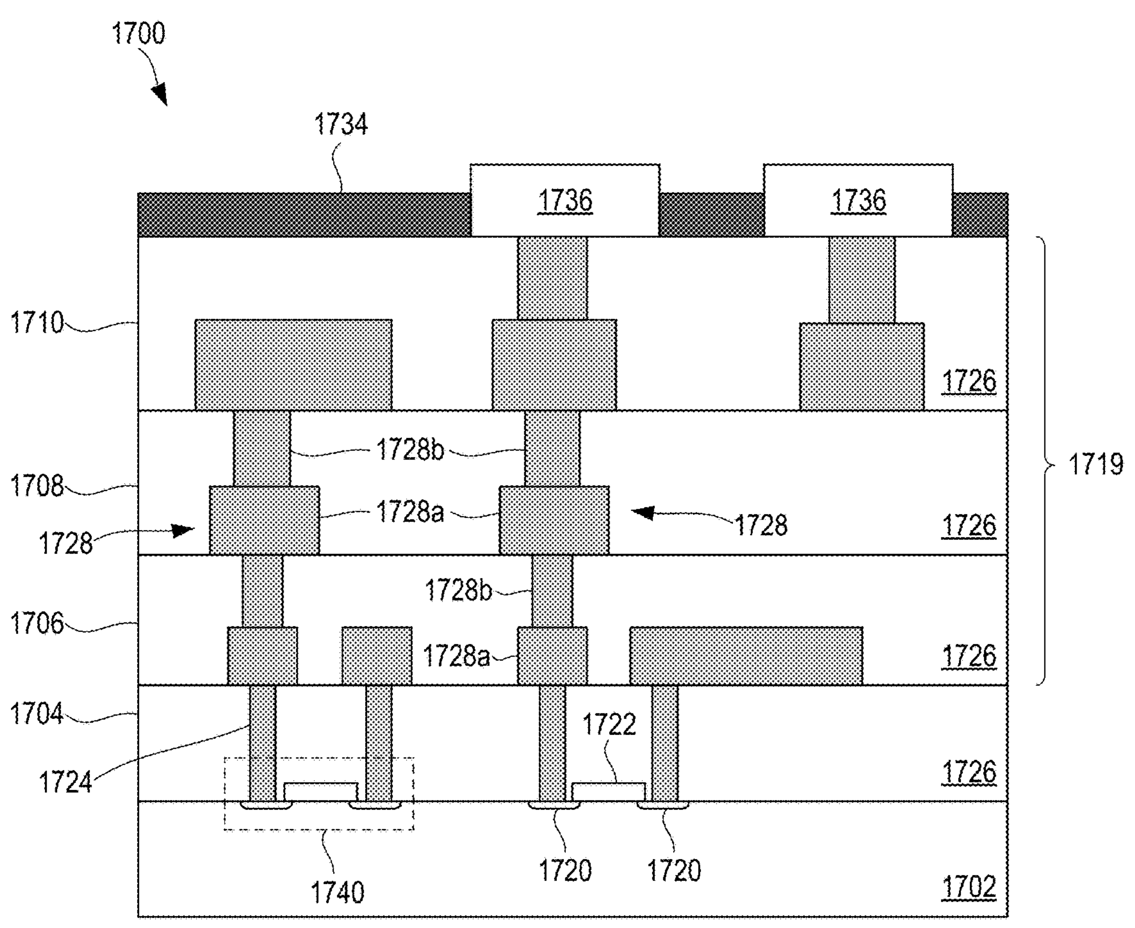
FIG. 17 is a cross-sectional side view of an integrated circuit device that may be included in a microelectronic assembly, in accordance with any of the embodiments disclosed herein.

FIG. 17 is a cross-sectional side view of an integrated circuit device 1700 that may include any of the capacitors 108, 110 disclosed herein. One or more of the integrated circuit devices 1700 may be included in one or more dies 1602 (FIG. 16). The integrated circuit device 1700 may be formed on a die substrate 1702 (e.g., the wafer 1600 of FIG. 16) and may be included in a die (e.g., the die 1602 of FIG. 16). The die substrate 1702 may be a semiconductor substrate composed of semiconductor material systems including, for example, n-type or p-type materials systems (or a combination of both). The die substrate 1702 may include, for example, a crystalline substrate formed using a bulk silicon or a silicon-on-insulator (SOI) substructure. In some embodiments, the die substrate 1702 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1702. Although a few examples of materials from which the die substrate 1702 may be formed are described here, any material that may serve as a foundation for an integrated circuit device 1700 may be used. The die substrate 1702 may be part of a singulated die (e.g., the dies 1602 of FIG. 16) or a wafer (e.g., the wafer 1600 of FIG. 16).

The integrated circuit device 1700 may include one or more device layers 1704 disposed on the die substrate 1702. The device layer 1704 may include features of one or more transistors 1740 (e.g., metal oxide semiconductor field-effect transistors (MOSFETs)) formed on the die substrate 1702. The transistors 1740 may include, for example, one or more source and/or drain (S/D) regions 1720, a gate 1722 to control current flow between the S/D regions 1720, and one or more S/D contacts 1724 to route electrical signals to/from the S/D regions 1720. The transistors 1740 may include additional features not depicted for the sake of clarity, such as device isolation regions, gate contacts, and the like. The transistors 1740 are not limited to the type and configuration depicted in FIG. 17 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 18A-18D are simplified perspective views of example planar, FinFET, gate-all-around, and stacked gate-all-around transistors. The transistors illustrated in FIGS. 18A-18D are formed on a substrate 1816 having a surface 1808. Isolation regions 1814 separate the source and drain regions of the transistors from other transistors and from a bulk region 1818 of the substrate 1816.

FIG. 18A is a perspective view of an example planar transistor 1800 comprising a gate 1802 that controls current flow between a source region 1804 and a drain region 1806. The transistor 1800 is planar in that the source region 1804 and the drain region 1806 are planar with respect to the substrate surface 1808.

FIG. 18B is a perspective view of an example FinFET transistor 1820 comprising a gate 1822 that controls current flow between a source region 1824 and a drain region 1826. The transistor 1820 is non-planar in that the source region 1824 and the drain region 1826 comprise "fins" that extend upwards from the substrate surface 1828. As the gate 1822 encompasses three sides of the semiconductor fin that extends from the source region 1824 to the drain region 1826, the transistor 1820 can be considered a tri-gate transistor. FIG. 18B illustrates one S/D fin extending through the gate 1822, but multiple S/D fins can extend through the gate of a FinFET transistor.

FIG. 18C is a perspective view of a gate-all-around (GAA) transistor 1840 comprising a gate 1842 that controls current flow between a source region 1844 and a drain region 1846. The transistor 1840 is non-planar in that the source region 1844 and the drain region 1846 are elevated from the substrate surface 1828.

FIG. 18D is a perspective view of a GAA transistor 1860 comprising a gate 1862 that controls current flow between multiple elevated source regions 1864 and multiple elevated drain regions 1866. The transistor 1860 is a stacked GAA transistor as the gate controls the flow of current between multiple elevated S/D regions stacked on top of each other. The transistors 1840 and 1860 are considered gate-all-around transistors as the gates encompass all sides of the semiconductor portions that extends from the source regions to the drain regions. The transistors 1840 and 1860 can alternatively be referred to as nanowire, nanosheet, or nanoribbon transistors depending on the width (e.g., widths 1848 and 1868 of transistors 1840 and 1860, respectively) of the semiconductor portions extending through the gate.

Returning to FIG. 17, a transistor 1740 may include a gate 1722 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1740 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1740 along the source-channel-drain direction, the gate electrode may consist of a U-shaped structure that includes a bottom portion substantially parallel to the surface of the die substrate 1702 and two sidewall portions that are substantially perpendicular to the top surface of the die substrate 1702. In other embodiments, at least one of the metal layers that form the gate electrode may simply be a planar layer that is substantially parallel to the top surface of the die substrate 1702 and does not include sidewall portions substantially perpendicular to the top surface of the die substrate 1702. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1720 may be formed within the die substrate 1702 adjacent to the gate 1722 of individual transistors 1740. The S/D regions 1720 may be formed using an implantation/diffusion process or an etching/deposition process, for example. In the former process, dopants such as boron, aluminum, antimony, phosphorous, or arsenic may be ion-implanted into the die substrate 1702 to form the S/D regions 1720. An annealing process that activates the dopants and causes them to diffuse farther into the die substrate 1702 may follow the ion-implantation process. In the latter process, the die substrate 1702 may first be etched to form recesses at the locations of the S/D regions 1720. An epitaxial deposition process may then be carried out to fill the recesses with material that is used to fabricate the S/D regions 1720. In some implementations, the S/D regions 1720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1720 may be formed using one or more alternate semiconductor materials such as germanium or a group III-V material or alloy. In further embodiments, one or more layers of metal and/or metal alloys may be used to form the S/D regions 1720.

Electrical signals, such as power and/or input/output (I/O) signals, may be routed to and/or from the devices (e.g., transistors 1740) of the device layer 1704 through one or more interconnect layers disposed on the device layer 1704 (illustrated in FIG. 17 as interconnect layers 1706-1710). For example, electrically conductive features of the device layer 1704 (e.g., the gate 1722 and the S/D contacts 1724) may be electrically coupled with the interconnect structures 1728 of the interconnect layers 1706-1710. The one or more interconnect layers 1706-1710 may form a metallization stack (also referred to as an "ILD stack") 1719 of the integrated circuit device 1700.

The interconnect structures 1728 may be arranged within the interconnect layers 1706-1710 to route electrical signals according to a wide variety of designs; in particular, the arrangement is not limited to the particular configuration of interconnect structures 1728 depicted in FIG. 17. Although a particular number of interconnect layers 1706-1710 is depicted in FIG. 17, embodiments of the present disclosure include integrated circuit devices having more or fewer interconnect layers than depicted.

In some embodiments, the interconnect structures 1728 may include lines 1728*a* and/or vias 1728*b* filled with an electrically conductive material such as a metal. The lines 1728*a* may be arranged to route electrical signals in a direction of a plane that is substantially parallel with a surface of the die substrate 1702 upon which the device layer 1704 is formed. For example, the lines 1728*a* may route electrical signals in a direction in and out of the page and/or in a direction across the page. The vias 1728*b* may be arranged to route electrical signals in a direction of a plane that is substantially perpendicular to the surface of the die substrate 1702 upon which the device layer 1704 is formed. In some embodiments, the vias 1728*b* may electrically couple lines 1728*a* of different interconnect layers 1706-1710 together.

The interconnect layers 1706-1710 may include a dielectric material 1726 disposed between the interconnect structures 1728, as shown in FIG. 17. In some embodiments, dielectric material 1726 disposed between the interconnect structures 1728 in different ones of the interconnect layers 1706-1710 may have different compositions; in other embodiments, the composition of the dielectric material 1726 between different interconnect layers 1706-1710 may be the same. The device layer 1704 may include a dielectric material 1726 disposed between the transistors 1740 and a bottom layer of the metallization stack as well. The dielectric material 1726 included in the device layer 1704 may have a different composition than the dielectric material 1726 included in the interconnect layers 1706-1710; in other embodiments, the composition of the dielectric material 1726 in the device layer 1704 may be the same as a dielectric material 1726 included in any one of the interconnect layers 1706-1710.

A first interconnect layer 1706 (referred to as Metal 1 or "M1") may be formed directly on the device layer 1704. In some embodiments, the first interconnect layer 1706 may include lines 1728*a* and/or vias 1728*b*, as shown. The lines 1728*a* of the first interconnect layer 1706 may be coupled with contacts (e.g., the S/D contacts 1724) of the device layer 1704. The vias 1728*b* of the first interconnect layer 1706 may be coupled with the lines 1728*a* of a second interconnect layer 1708.

The second interconnect layer 1708 (referred to as Metal 2 or "M2") may be formed directly on the first interconnect layer 1706. In some embodiments, the second interconnect layer 1708 may include via 1728*b* to couple the lines 1728 of the second interconnect layer 1708 with the lines 1728*a* of a third interconnect layer 1710. Although the lines 1728*a* and the vias 1728*b* are structurally delineated with a line within individual interconnect layers for the sake of clarity, the lines 1728*a* and the vias 1728*b* may be structurally and/or materially contiguous (e.g., simultaneously filled during a dual-damascene process) in some embodiments.

The third interconnect layer 1710 (referred to as Metal 3 or "M3") (and additional interconnect layers, as desired) may be formed in succession on the second interconnect layer 1708 according to similar techniques and configurations described in connection with the second interconnect layer 1708 or the first interconnect layer 1706. In some embodiments, the interconnect layers that are "higher up" in the metallization stack 1719 in the integrated circuit device 1700 (i.e., farther away from the device layer 1704) may be thicker that the interconnect layers that are lower in the metallization stack 1719, with lines 1728*a* and vias 1728*b* in the higher interconnect layers being thicker than those in the lower interconnect layers.

The integrated circuit device 1700 may include a solder resist material 1734 (e.g., polyimide or similar material) and one or more conductive contacts 1736 formed on the interconnect layers 1706-1710. In FIG. 17, the conductive contacts 1736 are illustrated as taking the form of bond pads. The conductive contacts 1736 may be electrically coupled with the interconnect structures 1728 and configured to route the electrical signals of the transistor(s) 1740 to external devices. For example, solder bonds may be formed on the one or more conductive contacts 1736 to mechanically and/or electrically couple an integrated circuit die including the integrated circuit device 1700 with another component (e.g., a printed circuit board). The integrated circuit device 1700 may include additional or alternate structures to route the electrical signals from the interconnect layers 1706-1710; for example, the conductive contacts 1736 may include other analogous features (e.g., posts) that route the electrical signals to external components.

In some embodiments in which the integrated circuit device 1700 is a double-sided die, the integrated circuit device 1700 may include another metallization stack (not shown) on the opposite side of the device layer(s) 1704. This metallization stack may include multiple interconnect layers as discussed above with reference to the interconnect layers 1706-1710, to provide conductive pathways (e.g., including conductive lines and vias) between the device layer(s) 1704 and additional conductive contacts (not shown) on the opposite side of the integrated circuit device 1700 from the conductive contacts 1736.

In other embodiments in which the integrated circuit device 1700 is a double-sided die, the integrated circuit device 1700 may include one or more through silicon vias (TSVs) through the die substrate 1702; these TSVs may make contact with the device layer(s) 1704, and may provide conductive pathways between the device layer(s) 1704 and additional conductive contacts (not shown) on the opposite side of the integrated circuit device 1700 from the conductive contacts 1736. In some embodiments, TSVs extending through the substrate can be used for routing power and ground signals from conductive contacts on the opposite side of the integrated circuit device 1700 from the conductive contacts 1736 to the transistors 1740 and any other components integrated into the die 1700, and the metallization stack 1719 can be used to route I/O signals from the conductive contacts 1736 to transistors 1740 and any other components integrated into the die 1700.

Multiple integrated circuit devices 1700 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 19:
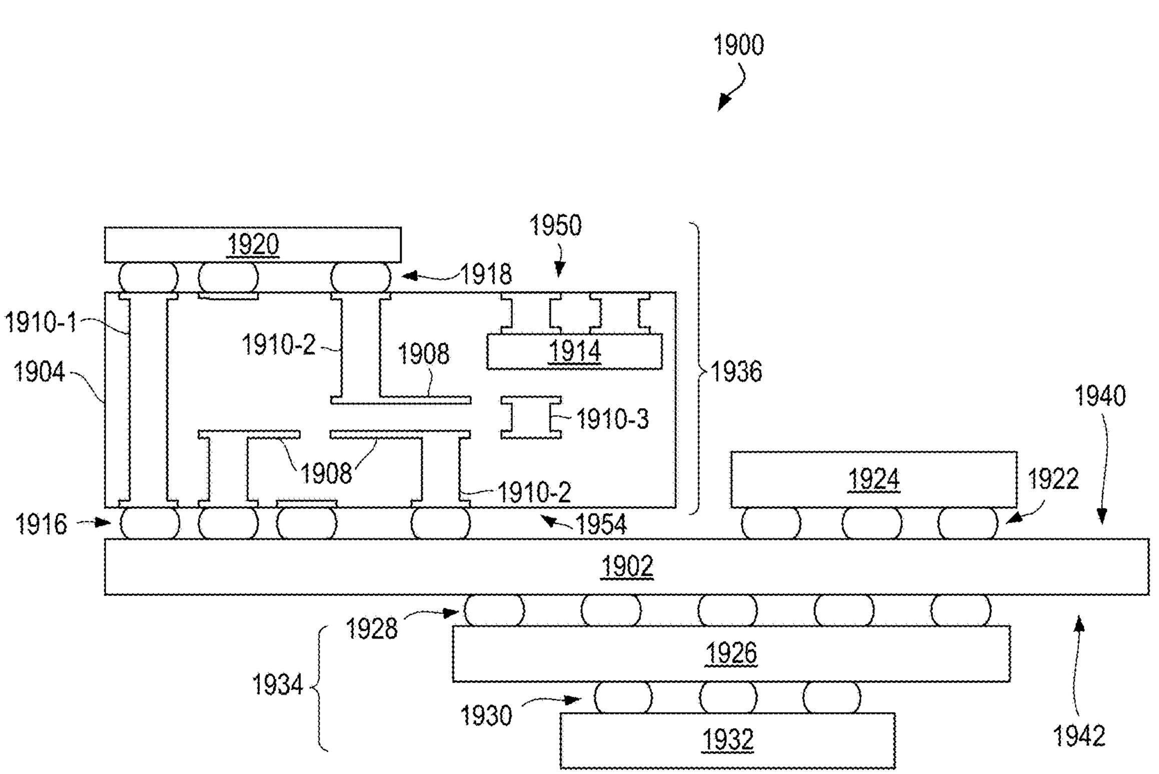
FIG. 19 is a cross-sectional side view of an integrated circuit device assembly that may include a microelectronic assembly, in accordance with any of the embodiments disclosed herein.

FIG. 19 is a cross-sectional side view of an integrated circuit device assembly 1900 that may include any of the capacitors 108, 110 disclosed herein. The integrated circuit device assembly 1900 includes a number of components disposed on a circuit board 1902 (which may be a motherboard, system board, mainboard, etc.). The integrated circuit device assembly 1900 includes components disposed on a first face 1940 of the circuit board 1902 and an opposing second face 1942 of the circuit board 1902; generally, components may be disposed on one or both faces 1940 and 1942.

In some embodiments, the circuit board 1902 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1902. In other embodiments, the circuit board 1902 may be a non-PCB substrate. In some embodiments the circuit board 1902 may, for example, support the base die 102. The integrated circuit device assembly 1900 illustrated in FIG. 19 includes a package-on-interposer structure 1936 coupled to the first face 1940 of the circuit board 1902 by coupling components 1916. The coupling components 1916 may electrically and mechanically couple the package-on-interposer structure 1936 to the circuit board 1902, and may include solder balls (as shown in FIG. 19), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1936 may include an integrated circuit component 1920 coupled to an interposer 1904 by coupling components 1918. The coupling components 1918 may take any suitable form for the application, such as the forms discussed above with reference to the coupling components 1916. Although a single integrated circuit component 1920 is shown in FIG. 19, multiple integrated circuit components may be coupled to the interposer 1904; indeed, additional interposers may be coupled to the interposer 1904. The interposer 1904 may provide an intervening substrate used to bridge the circuit board 1902 and the integrated circuit component 1920.

The integrated circuit component 1920 may be a packaged or unpacked integrated circuit product that includes one or more integrated circuit dies (e.g., the die 1602 of FIG. 16, the integrated circuit device 1700 of FIG. 17) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1920, a single monolithic integrated circuit die comprises solder bumps attached to contacts on the die. The solder bumps allow the die to be directly attached to the interposer 1904. The integrated circuit component 1920 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1920 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1920 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1920 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1904 may spread connections to a wider pitch or reroute a connection to a different connection. For example, the interposer 1904 may couple the integrated circuit component 1920 to a set of ball grid array (BGA) conductive contacts of the coupling components 1916 for coupling to the circuit board 1902. In the embodiment illustrated in FIG. 19, the integrated circuit component 1920 and the circuit board 1902 are attached to opposing sides of the interposer 1904; in other embodiments, the integrated circuit component 1920 and the circuit board 1902 may be attached to a same side of the interposer 1904. In some embodiments, three or more components may be interconnected by way of the interposer 1904.

In some embodiments, the interposer 1904 may be formed as a PCB, including multiple metal layers separated from one another by layers of dielectric material and interconnected by electrically conductive vias. In some embodiments, the interposer 1904 may be formed of an epoxy resin, a fiberglass-reinforced epoxy resin, an epoxy resin with inorganic fillers, a ceramic material, or a polymer material such as polyimide. In some embodiments, the interposer 1904 may be formed of alternate rigid or flexible materials that may include the same materials described above for use in a semiconductor substrate, such as silicon, germanium, and other group III-V and group IV materials. The interposer 1904 may include metal interconnects 1908 and vias 1910, including but not limited to through hole vias 1910-1 (that extend from a first face 1950 of the interposer 1904 to a second face 1954 of the interposer 1904), blind vias 1910-2 (that extend from the first or second faces 1950 or 1954 of the interposer 1904 to an internal metal layer), and buried vias 1910-3 (that connect internal metal layers).

In some embodiments, the interposer 1904 can comprise a silicon interposer. Through silicon vias (TSV) extending through the silicon interposer can connect connections on a first face of a silicon interposer to an opposing second face of the silicon interposer. In some embodiments, an interposer 1904 comprising a silicon interposer can further comprise one or more routing layers to route connections on a first face of the interposer 1904 to an opposing second face of the interposer 1904.

The interposer 1904 may further include embedded devices 1914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1904. The package-on-interposer structure 1936 may take the form of any of the package-on-interposer structures known in the art. In embodiments where the interposer is a non-printed circuit board The integrated circuit device assembly 1900 may include an integrated circuit component 1924 coupled to the first face 1940 of the circuit board 1902 by coupling components 1922. The coupling components 1922 may take the form of any of the embodiments discussed above with reference to the coupling components 1916, and the integrated circuit component 1924 may take the form of any of the embodiments discussed above with reference to the integrated circuit component 1920.

The integrated circuit device assembly 1900 illustrated in FIG. 19 includes a package-on-package structure 1934 coupled to the second face 1942 of the circuit board 1902 by coupling components 1928. The package-on-package structure 1934 may include an integrated circuit component 1926 and an integrated circuit component 1932 coupled together by coupling components 1930 such that the integrated circuit component 1926 is disposed between the circuit board 1902 and the integrated circuit component 1932. The coupling components 1928 and 1930 may take the form of any of the embodiments of the coupling components 1916 discussed above, and the integrated circuit components 1926 and 1932 may take the form of any of the embodiments of the integrated circuit component 1920 discussed above. The package-on-package structure 1934 may be configured in accordance with any of the package-on-package structures known in the art.

FIG. 20 is a block diagram of an example electrical device 2000 that may include one or more of the capacitors 108, 110 disclosed herein. For example, any suitable ones of the components of the electrical device 2000 may include one or more of the integrated circuit device assemblies 1900, integrated circuit components 1920, integrated circuit devices 1700, or integrated circuit dies 1602 disclosed herein, and may be arranged in any of the microelectronic assemblies disclosed herein. A number of components are illustrated in FIG. 20 as included in the electrical device 2000, but any one or more of these components may be omitted or duplicated, as suitable for the application. In some embodiments, some or all of the components included in the electrical device 2000 may be attached to one or more motherboards mainboards, or system boards. In some embodiments, one or more of these components are fabricated onto a single system-on-a-chip (SoC) die.

Additionally, in various embodiments, the electrical device 2000 may not include one or more of the components illustrated in FIG. 20, but the electrical device 2000 may include interface circuitry for coupling to the one or more components. For example, the electrical device 2000 may not include a display device 2006, but may include display device interface circuitry (e.g., a connector and driver circuitry) to which a display device 2006 may be coupled. In another set of examples, the electrical device 2000 may not include an audio input device 2024 or an audio output device 2008, but may include audio input or output device interface circuitry (e.g., connectors and supporting circuitry) to which an audio input device 2024 or audio output device 2008 may be coupled.

The electrical device 2000 may include one or more processor units 2002 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 2002 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 2000 may include a memory 2004, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 2004 may include memory that is located on the same integrated circuit die as the processor unit 2002. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 2000 can comprise one or more processor units 2002 that are heterogeneous or asymmetric to another processor unit 2002 in the electrical device 2000. There can be a variety of differences between the processing units 2002 in a system in terms of a spectrum of metrics of merit including architectural, microarchitectural, thermal, power consumption characteristics, and the like. These differences can effectively manifest themselves as asymmetry and heterogeneity among the processor units 2002 in the electrical device 2000.

In some embodiments, the electrical device 2000 may include a communication component 2012 (e.g., one or more communication components). For example, the communication component 2012 can manage wireless communications for the transfer of data to and from the electrical device 2000. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 2012 may operate in accordance with other wireless protocols in other embodiments. The electrical device 2000 may include an antenna 2022 to facilitate wireless communications and/or to receive other wireless communications (such as AM or FM radio transmissions).

In some embodiments, the communication component 2012 may manage wired communications, such as electrical, optical, or any other suitable communication protocols (e.g., IEEE 802.3 Ethernet standards). As noted above, the communication component 2012 may include multiple communication components. For instance, a first communication component 2012 may be dedicated to shorter-range wireless communications such as Wi-Fi or Bluetooth, and a second communication component 2012 may be dedicated to longer-range wireless communications such as global positioning system (GPS), EDGE, GPRS, CDMA, WiMAX, LTE, EV-DO, or others. In some embodiments, a first communication component 2012 may be dedicated to wireless communications, and a second communication component 2012 may be dedicated to wired communications.

The electrical device 2000 may include battery/power circuitry 2014. The battery/power circuitry 2014 may include one or more energy storage devices (e.g., batteries or capacitors) and/or circuitry for coupling components of the electrical device 2000 to an energy source separate from the electrical device 2000 (e.g., AC line power).

The electrical device 2000 may include a display device 2006 (or corresponding interface circuitry, as discussed above). The display device 2006 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 2000 may include an audio output device 2008 (or corresponding interface circuitry, as discussed above). The audio output device 2008 may include any embedded or wired or wirelessly connected external device that generates an audible indicator, such speakers, headsets, or earbuds.

The electrical device 2000 may include an audio input device 2024 (or corresponding interface circuitry, as discussed above). The audio input device 2024 may include any embedded or wired or wirelessly connected device that generates a signal representative of a sound, such as microphones, microphone arrays, or digital instruments (e.g., instruments having a musical instrument digital interface (MIDI) output). The electrical device 2000 may include a Global Navigation Satellite System (GNSS) device 2018 (or corresponding interface circuitry, as discussed above), such as a Global Positioning System (GPS) device. The GNSS device 2018 may be in communication with a satellite-based system and may determine a geolocation of the electrical device 2000 based on information received from one or more GNSS satellites, as known in the art.

The electrical device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The electrical device 2000 may include an other input device 2020 (or corresponding interface circuitry, as discussed above). Examples of the other input device 2020 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 2000 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 2000 may be any other electronic device that processes data. In some embodiments, the electrical device 2000 may comprise multiple discrete physical components. Given the range of devices that the electrical device 2000 can be manifested as in various embodiments, in some embodiments, the electrical device 2000 can be referred to as a computing device or a computing system.

EXAMPLES

Illustrative examples of the technologies disclosed herein are provided below. An embodiment of the technologies may include any one or more, and any combination of, the examples described below.

Example 1 includes a device comprising a capacitor, the capacitor comprising a first metal layer on a substrate; a high-k dielectric layer adjacent the first metal layer; and a second metal layer adjacent the high-k dielectric layer; a first electrode comprising part of the first metal layer and part of the second metal layer; and a second electrode comprising part of the first metal layer and part of the second metal layer, wherein, in use, an electric field of the capacitor is substantially parallel to the high-k dielectric layer.

Example 2 includes the subject matter of Example 1, and further including a second capacitor, the second capacitor comprising a first electrode comprising part of the first metal layer; and a second electrode comprising part of the second metal layer, wherein, in use, an electric field of the second capacitor is substantially perpendicular to the high-k dielectric layer.

Example 3 includes the subject matter of any of Examples 1 and 2, and further including compute circuitry, wherein the compute circuitry in a high-power mode is to use the second capacitor as a voltage support device, wherein the compute circuitry in a low-power mode is to use the capacitor as a voltage support device.

Example 4 includes the subject matter of any of Examples 1-3, and further including a die, wherein the die comprises the capacitor, the second capacitor, and the compute circuitry.

Example 5 includes the subject matter of any of Examples 1-4, and further including a first die and a second die different from the first die, wherein the first die comprises the capacitor and the second capacitor, wherein the second die comprises the compute circuitry.

Example 6 includes the subject matter of any of Examples 1-5, and wherein most of the part of the first electrode of the first metal layer of the second capacitor is directly above the part of the second electrode of the second metal layer of the second capacitor.

Example 7 includes the subject matter of any of Examples 1-6, and wherein the first electrode of the second capacitor comprises deep trenches and the second electrode of the second capacitor comprises deep trenches.

Example 8 includes the subject matter of any of Examples 1-7, and wherein the high-k dielectric layer has a relative permittivity of at least 1,000.

Example 9 includes the subject matter of any of Examples 1-8, and wherein, for the first metal layer and the second metal layer, the first electrode is separated from the second electrode by at least twice a thickness of the high-k dielectric layer.

Example 10 includes the subject matter of any of Examples 1-9, and further including an on-die circuit to absorb radiofrequency (RF) interference, wherein the on-die circuit to absorb RF interference comprises the capacitor.

Example 11 includes the subject matter of any of Examples 1-10, and wherein the capacitor comprises a plurality of unit cells, wherein individual unit cells of the plurality of unit cells comprises a plurality of vias of the first electrode that extend through the high-k dielectric layer and a plurality of vias from the second electrode that extend through the high-k dielectric layer, wherein, in use, for individual unit cells of the plurality of unit cells, an electric field of the capacitor extends from individual vias of the plurality of vias of the first electrode to individual vias of the plurality of vias of the second electrode.

Example 12 includes the subject matter of any of Examples 1-11, and wherein vias connected to the first electrode passing from the first metal layer to the second metal layer do not pass through the second electrode, wherein vias connected to the second electrode passing from the first metal layer to the second metal layer do not pass through the first electrode.

Example 13 includes the subject matter of any of Examples 1-12, and wherein the high-k dielectric layer has a thickness less than 2 micrometers, wherein a voltage across the first electrode and the second electrode is over 3 volts.

Example 14 includes a device comprising a capacitor, the capacitor comprising a first metal layer on a substrate; a high-k dielectric layer adjacent the first metal layer; and a second metal layer adjacent the high-k dielectric layer; a first electrode comprising part of the first metal layer and part of the second metal layer; and a second electrode comprising part of the first metal layer and part of the second metal layer, wherein, for the first metal layer and the second metal layer, the first electrode is separated from the second electrode by at least twice a thickness of the high-k dielectric layer.

Example 15 includes the subject matter of Example 14, and further including a second capacitor, the second capacitor comprising a first electrode comprising part of the first metal layer; and a second electrode comprising part of the second metal layer, wherein, in use, an electric field of the second capacitor is substantially perpendicular to the high-k dielectric layer.

Example 16 includes the subject matter of any of Examples 14 and 15, and further including compute circuitry, wherein the compute circuitry in a high-power mode is to use the second capacitor as a voltage support device, wherein the compute circuitry in a low-power mode is to use the capacitor as a voltage support device.

Example 17 includes the subject matter of any of Examples 14-16, and further including a die, wherein the die comprises the capacitor, the second capacitor, and the compute circuitry.

Example 18 includes the subject matter of any of Examples 14-17, and further including a first die and a second die different from the first die, wherein the first die comprises the capacitor and the second capacitor, wherein the second die comprises the compute circuitry.

Example 19 includes the subject matter of any of Examples 14-18, and wherein most of the part of the first electrode of the first metal layer of the second capacitor is directly above the part of the second electrode of the second metal layer of the second capacitor.

Example 20 includes the subject matter of any of Examples 14-19, and wherein the first electrode of the second capacitor comprises deep trenches and the second electrode of the second capacitor comprises deep trenches.

Example 21 includes the subject matter of any of Examples 14-20, and wherein the high-k dielectric layer has a relative permittivity of at least 1,000.

Example 22 includes the subject matter of any of Examples 14-21, and wherein, for the first metal layer and the second metal layer, the first electrode is separated from the second electrode by at least twice a thickness of the high-k dielectric layer.

Example 23 includes the subject matter of any of Examples 14-22, and further including an on-die circuit to absorb radiofrequency (RF) interference, wherein the on-die circuit to absorb RF interference comprises the capacitor.

Example 24 includes the subject matter of any of Examples 14-23, and wherein the capacitor comprises a plurality of unit cells, wherein individual unit cells of the plurality of unit cells comprises a plurality of vias of the first electrode that extend through the high-k dielectric layer and a plurality of vias from the second electrode that extend through the high-k dielectric layer, wherein, in use, for individual unit cells of the plurality of unit cells, an electric field of the capacitor extends from individual vias of the plurality of vias of the first electrode to individual vias of the plurality of vias of the second electrode.

Example 25 includes the subject matter of any of Examples 14-24, and wherein vias connected to the first electrode passing from the first metal layer to the second metal layer do not pass through the second electrode, wherein vias connected to the second electrode passing from the first metal layer to the second metal layer do not pass through the first electrode.

Example 26 includes the subject matter of any of Examples 14-25, and wherein the high-k dielectric layer has a thickness less than 2 micrometers, wherein a voltage across the first electrode and the second electrode is over 3 volts.

Example 27 includes a device comprising a first metal layer on a substrate; a high-k dielectric layer adjacent the first metal layer; a second metal layer on the substrate; and means for creating a capacitor from the first metal layer, the high-k dielectric layer, and the second metal layer with an electric field substantially parallel to the high-k dielectric layer.

Example 28 includes the subject matter of Example 27, and further including means for creating a second capacitor from the first metal layer, the high-k dielectric layer, and the second metal layer with an electric field substantially perpendicular to the high-k dielectric layer.

Example 29 includes the subject matter of any of Examples 27 and 28, and further including compute circuitry, wherein the compute circuitry in a high-power mode is to use the second capacitor as a voltage support device, wherein the compute circuitry in a low-power mode is to use the capacitor as a voltage support device.

Example 30 includes the subject matter of any of Examples 27-29, and further including a die, wherein the die comprises the capacitor, the second capacitor, and the compute circuitry.

Example 31 includes the subject matter of any of Examples 27-30, and further including a first die and a second die different from the first die, wherein the first die comprises the capacitor and the second capacitor, wherein the second die comprises the compute circuitry.

Example 32 includes the subject matter of any of Examples 27-31, and wherein the means for creating the second capacitor comprises deep trenches.

Example 33 includes the subject matter of any of Examples 27-32, and wherein the high-k dielectric layer has a relative permittivity of at least 1,000.

Example 34 includes the subject matter of any of Examples 27-33, and further including an on-die circuit to absorb radiofrequency (RF) interference, wherein the on-die circuit to absorb RF interference comprises the capacitor.

Example 35 includes the subject matter of any of Examples 27-34, and wherein the capacitor comprises a plurality of unit cells, wherein individual unit cells of the plurality of unit cells comprises a plurality of vias of a first electrode that extend through the high-k dielectric layer and a plurality of vias from a second electrode that extend through the high-k dielectric layer, wherein, in use, for individual unit cells of the plurality of unit cells, an electric field of the capacitor extends from individual vias of the plurality of vias of the first electrode to individual vias of the plurality of vias of the second electrode.

The invention claimed is:

1. A device comprising:

a capacitor, the capacitor comprising:

a first metal layer on a substrate;

a high-k dielectric layer adjacent the first metal layer; and a second metal layer adjacent the high-k dielectric layer;

a first electrode comprising part of the first metal layer and part of the second metal layer; and a second electrode comprising part of the first metal layer and part of the second metal layer, wherein, in use, an electric field of the capacitor is substantially parallel to the high-k dielectric layer; and a second capacitor, the second capacitor comprising:

a first electrode comprising part of the first metal layer; and a second electrode comprising part of the second metal layer, wherein, in use, an electric field of the second capacitor is substantially perpendicular to the high-k dielectric layer.

2. The device of claim 1, further comprising:

compute circuitry, wherein the compute circuitry in a high-power mode is to use the second capacitor as a voltage support device, wherein the compute circuitry in a low-power mode is to use the capacitor as a voltage support device.

3. The device of claim 2, further comprising a die, wherein the die comprises the capacitor, the second capacitor, and the compute circuitry.

4. The device of claim 2, further comprising a first die and a second die different from the first die, wherein the first die comprises the capacitor and the second capacitor, wherein the second die comprises the compute circuitry.

5. The device of claim 1, wherein most of the part of the first electrode of the first metal layer of the second capacitor is directly above the part of the second electrode of the second metal layer of the second capacitor.

6. The device of claim 1, wherein the first electrode of the second capacitor comprises deep trenches and the second electrode of the second capacitor comprises deep trenches.

7. The device of claim 1, wherein the high-k dielectric layer has a relative permittivity of at least 1,000.

8. The device of claim 1, wherein, for the first metal layer and the second metal layer, the first electrode is separated from the second electrode by at least twice a thickness of the high-k dielectric layer.

9. The device of claim 1, further comprising an on-die circuit to absorb radiofrequency (RF) interference, wherein the on-die circuit to absorb RF interference comprises the capacitor.

10. The device of claim 1, wherein the capacitor comprises a plurality of unit cells, wherein individual unit cells of the plurality of unit cells comprises a plurality of vias of the first electrode that extend through the high-k dielectric layer and a plurality of vias from the second electrode that extend through the high-k dielectric layer, wherein, in use, for individual unit cells of the plurality of unit cells, an electric field of the capacitor extends from individual vias of the plurality of vias of the first electrode to individual vias of the plurality of vias of the second electrode.

11. The device of claim 1, wherein vias connected to the first electrode passing from the first metal layer to the second metal layer do not pass through the second electrode,
 wherein vias connected to the second electrode passing from the first metal layer to the second metal layer do not pass through the first electrode.

12. The device of claim 1, wherein the high-k dielectric layer has a thickness less than 2 micrometers, wherein a voltage across the first electrode and the second electrode is over 3 volts.

13. A device comprising:
 a capacitor, the capacitor comprising:
  a first metal layer on a substrate;
  a high-k dielectric layer adjacent the first metal layer; and
  a second metal layer adjacent the high-k dielectric layer;
  a first electrode comprising part of the first metal layer and part of the second metal layer; and
  a second electrode comprising part of the first metal layer and part of the second metal layer,
  wherein, for the first metal layer and the second metal layer, the first electrode is separated from the second electrode by at least twice a thickness of the high-k dielectric layer;
 a second capacitor, the second capacitor comprising:
  a first electrode comprising part of the first metal layer; and
  a second electrode comprising part of the second metal layer,
  wherein, in use, an electric field of the second capacitor is substantially perpendicular to the high-k dielectric layer; and
 compute circuitry, wherein the compute circuitry in a high-power mode is to use the second capacitor as a voltage support device, wherein the compute circuitry in a low-power mode is to use the capacitor as a voltage support device.

14. The device of claim 13, further comprising a die, wherein the die comprises the capacitor, the second capacitor, and the compute circuitry.

15. The device of claim 13, further comprising a first die and a second die different from the first die, wherein the first die comprises the capacitor and the second capacitor, wherein the second die comprises the compute circuitry.

16. The device of claim 13, wherein most of the part of the first electrode of the first metal layer of the second capacitor is directly above the part of the second electrode of the second metal layer of the second capacitor.

17. The device of claim 13, wherein the high-k dielectric layer has a relative permittivity of at least 1,000.

18. The device of claim 13, further comprising an on-die circuit to absorb radiofrequency (RF) interference, wherein the on-die circuit to absorb RF interference comprises the capacitor.

19. The device of claim 13, wherein the high-k dielectric layer has a thickness less than 2 micrometers, wherein a voltage across the first electrode and the second electrode is over 3 volts.

20. A device comprising:
 a first metal layer on a substrate;
 a high-k dielectric layer adjacent the first metal layer;
 a second metal layer on the substrate;
 means for creating a capacitor from the first metal layer, the high-k dielectric layer, and the second metal layer with an electric field substantially parallel to the high-k dielectric layer; and
 means for creating a second capacitor from the first metal layer, the high-k dielectric layer, and the second metal layer with an electric field substantially perpendicular to the high-k dielectric layer.

21. The device of claim 20, further comprising:
 compute circuitry, wherein the compute circuitry in a high-power mode is to use the second capacitor as a voltage support device, wherein the compute circuitry in a low-power mode is to use the capacitor as a voltage support device.

* * * * *